United States Patent
Hara

(10) Patent No.: US 10,180,876 B2
(45) Date of Patent: Jan. 15, 2019

(54) MEMORY CONTROLLER AND SEMICONDUCTOR MEMORY DEVICE

(71) Applicant: TOSHIBA MEMORY CORPORATION, Minato-ku (JP)

(72) Inventor: Tokumasa Hara, Kawasaki (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 24 days.

(21) Appl. No.: 15/058,624

(22) Filed: Mar. 2, 2016

(65) Prior Publication Data
US 2017/0039003 A1 Feb. 9, 2017

Related U.S. Application Data

(60) Provisional application No. 62/200,892, filed on Aug. 4, 2015.

(51) Int. Cl.
*G11C 29/00* (2006.01)
*G06F 11/10* (2006.01)
*G11C 29/52* (2006.01)

(52) U.S. Cl.
CPC .......... *G06F 11/1068* (2013.01); *G11C 29/52* (2013.01)

(58) Field of Classification Search
CPC .............................. G06F 11/1068; G11C 29/52
See application file for complete search history.

(56) References Cited

U.S. PATENT DOCUMENTS

| 9,251,892 | B1 * | 2/2016 | Asami | G11G 11/5642 |
| 9,330,775 | B2 * | 5/2016 | Kim | G11C 16/28 |
| 9,552,887 | B2 * | 1/2017 | Kim | G11C 11/5642 |
| 9,558,816 | B2 * | 1/2017 | Han | G11C 16/26 |
| 2008/0310234 | A1 | 12/2008 | Lee et al. | |
| 2009/0310404 | A1 * | 12/2009 | Cho | G11C 7/06 365/185.2 |
| 2011/0176362 | A1 * | 7/2011 | Shibata | G11C 11/5635 365/185.03 |
| 2012/0230104 | A1 | 9/2012 | Kim et al. | |
| 2012/0269003 | A1 * | 10/2012 | Kim | G11C 16/3454 365/185.22 |
| 2014/0010017 | A1 * | 1/2014 | Lee | G11C 16/26 365/185.18 |
| 2014/0115424 | A1 * | 4/2014 | Yoo | G06F 12/00 714/763 |
| 2014/0119124 | A1 * | 5/2014 | Kim | G11C 11/5642 365/185.18 |
| 2014/0129902 | A1 | 5/2014 | Yoon et al. | |

(Continued)

*Primary Examiner* — Thien Nguyen
(74) *Attorney, Agent, or Firm* — Oblon, McClelland, Maier & Neustadt, L.L.P.

(57) ABSTRACT

A memory controller includes: a host interface configured to receive a read command from the outside of the memory controller; and a read controller configured to perform a data read operation on a memory device according to the read command. The read controller performs a data read operation on a set of memory cells and determines a first and second values. The first value is a number of memory cells having a first threshold voltage among the set of memory cells, and the second value is a number of memory cells having a second threshold voltage among the set of memory cells. The read controller determines a first read voltage based on only the first and second values and performs a data read operation on the set of memory cells using the first read voltage.

18 Claims, 19 Drawing Sheets

(56) References Cited

U.S. PATENT DOCUMENTS

2014/0153330 A1\* 6/2014 Yoon .................. G11C 11/5642
                                              365/185.03
2014/0198569 A1\* 7/2014 Kim ..................... G11C 16/28
                                              365/185.03
2015/0043282 A1\* 2/2015 Shin ................... G11C 16/3495
                                              365/185.21

\* cited by examiner

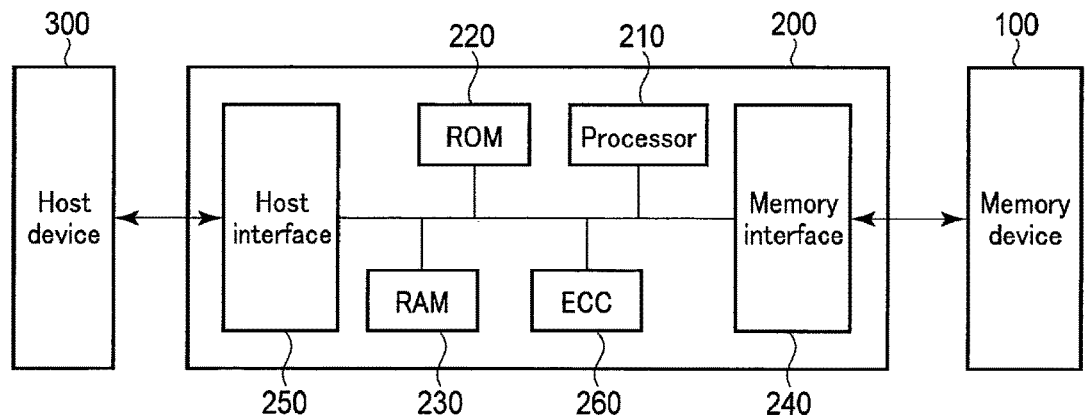
F I G. 1
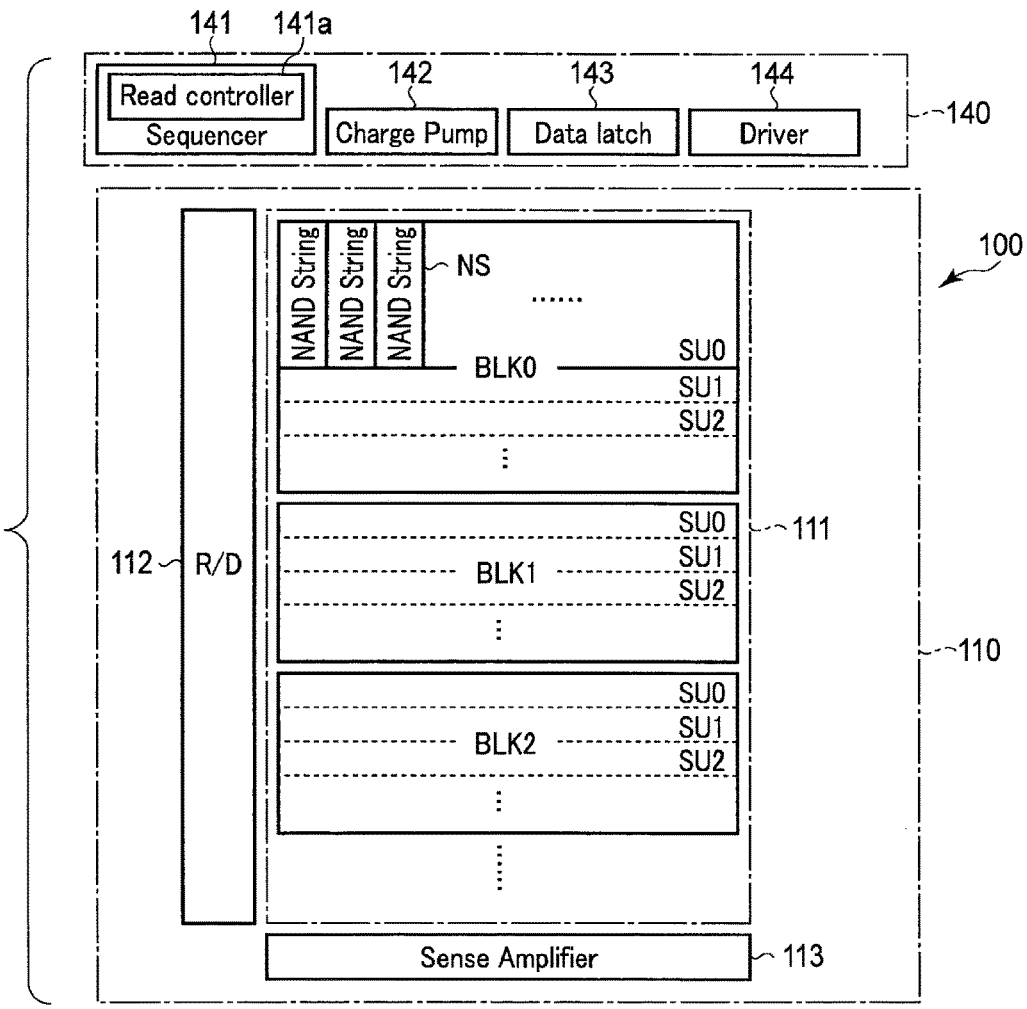
F I G. 2

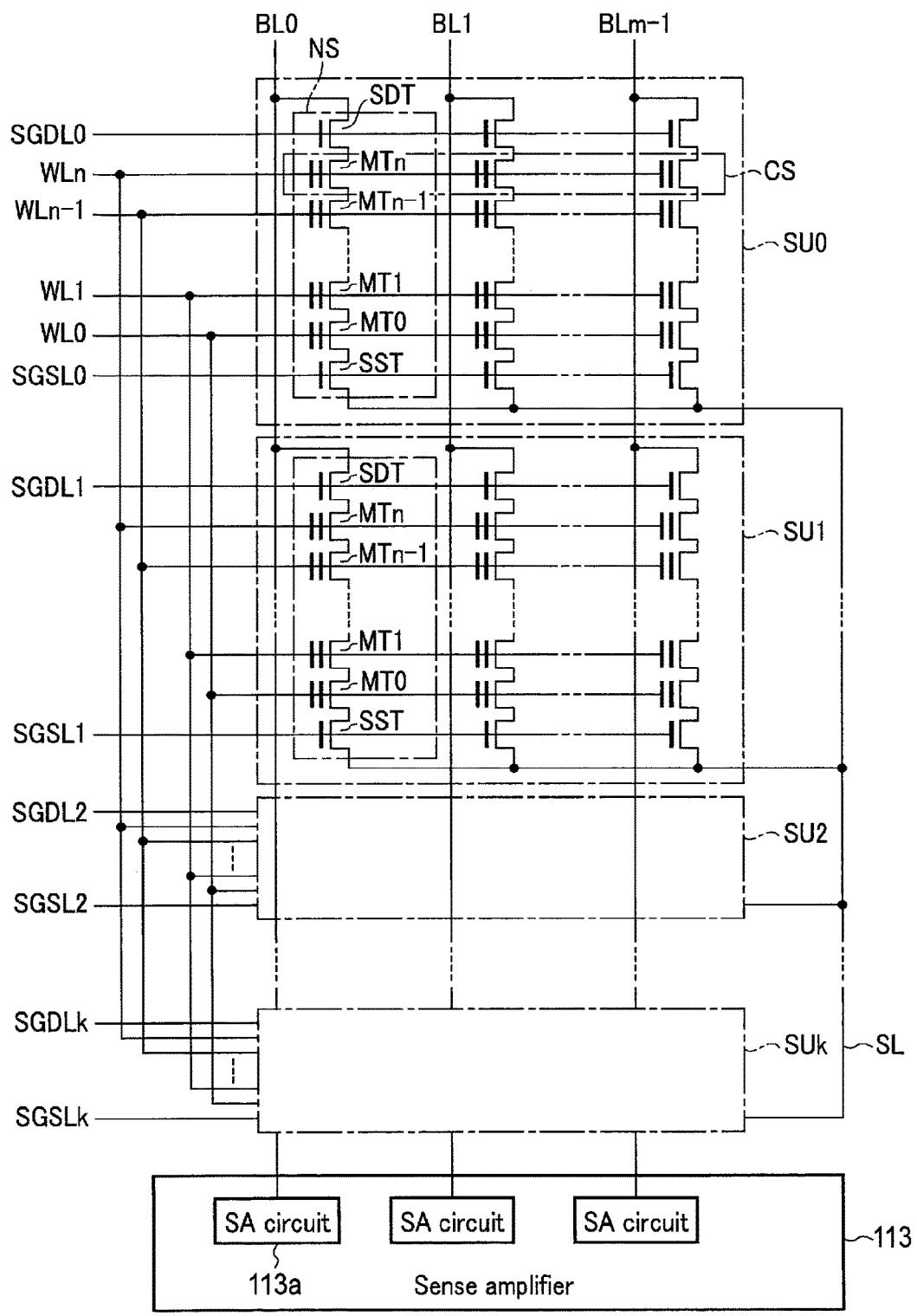
F I G. 3

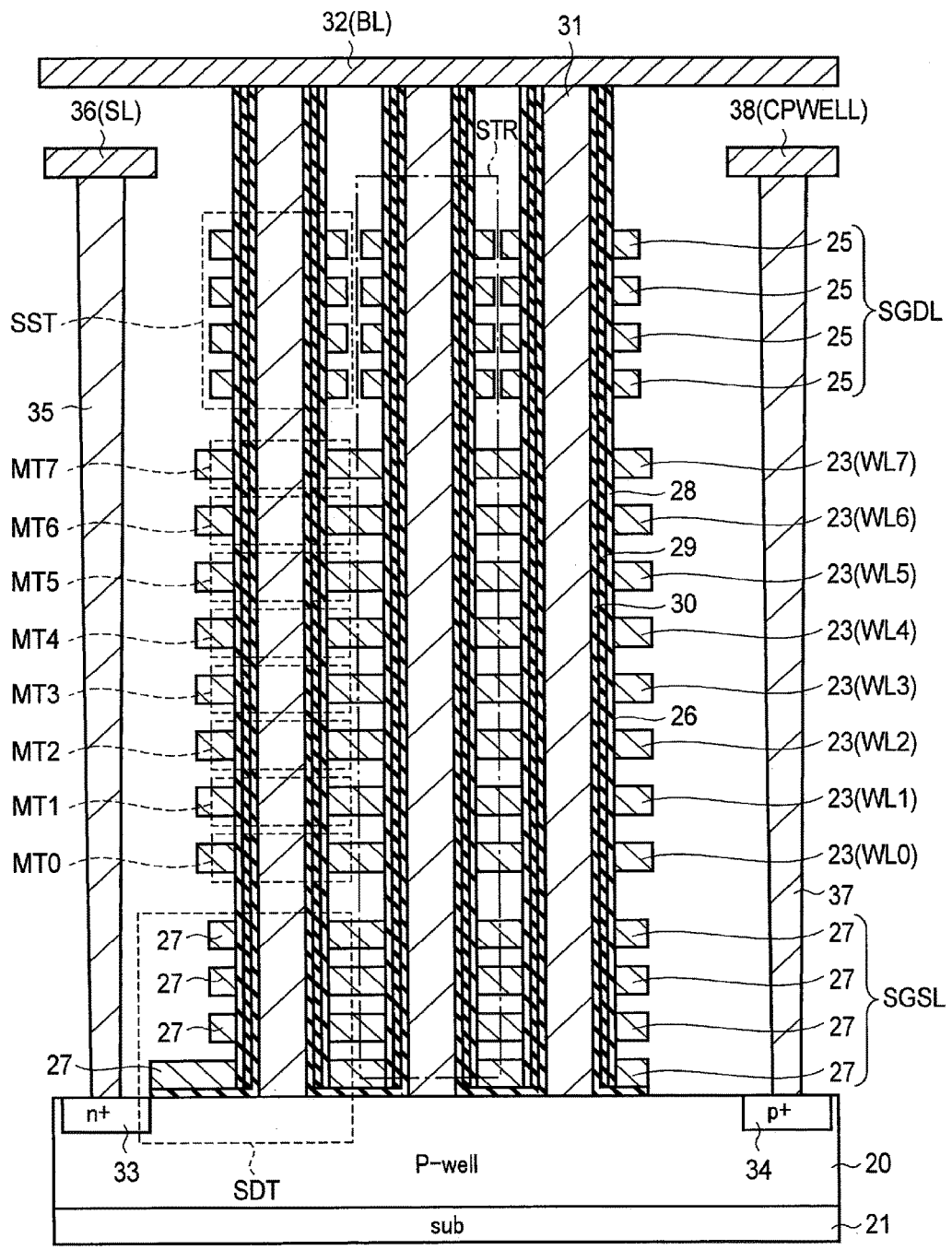
F I G. 4

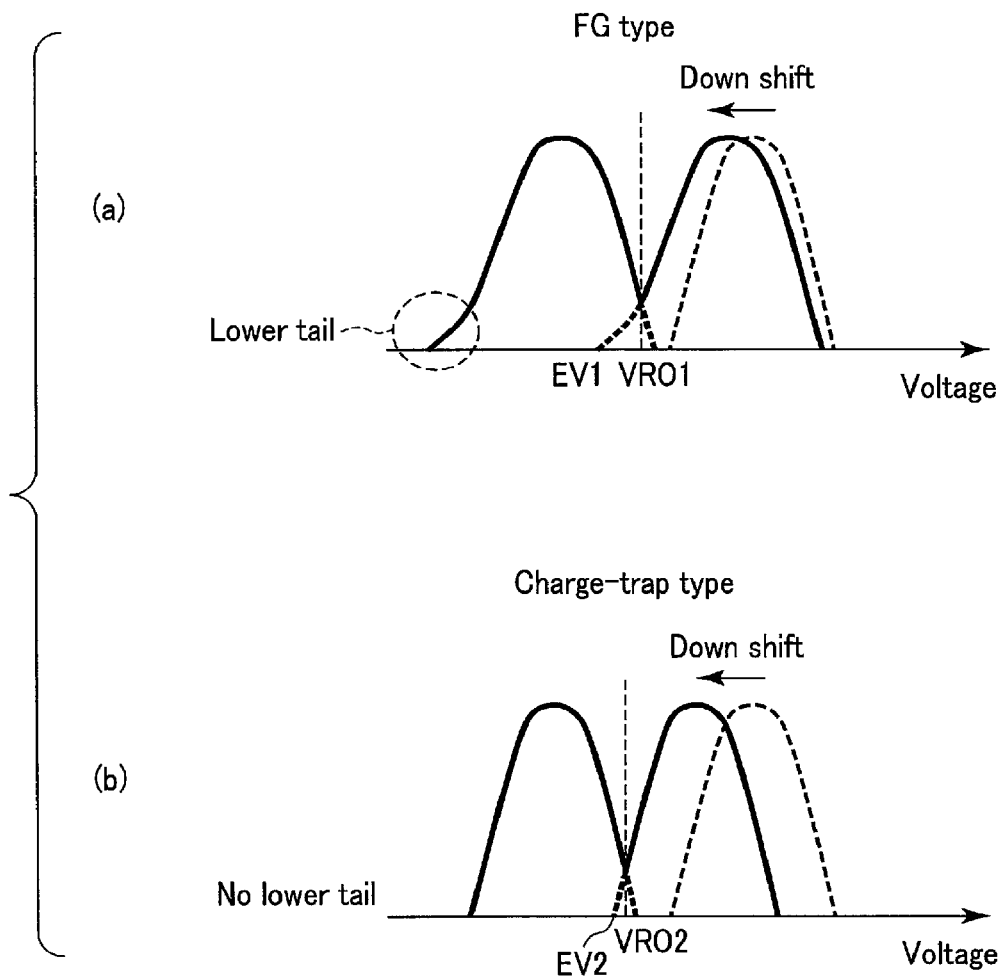
F I G. 6

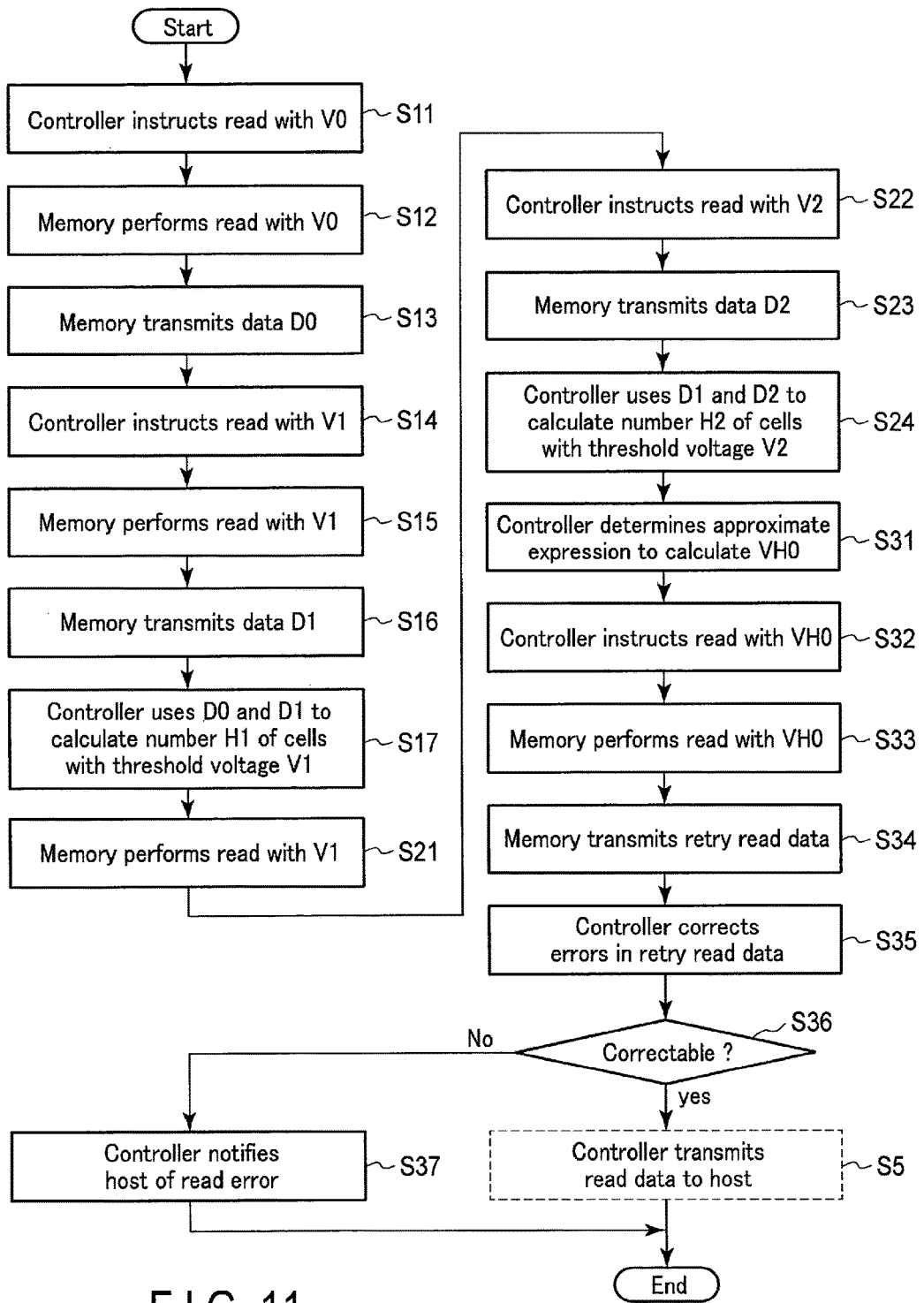
F I G. 11

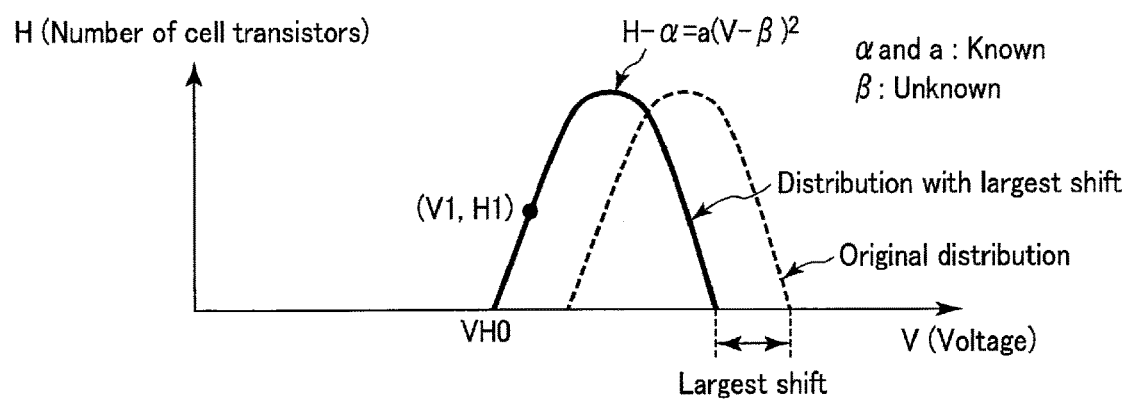
F I G. 12

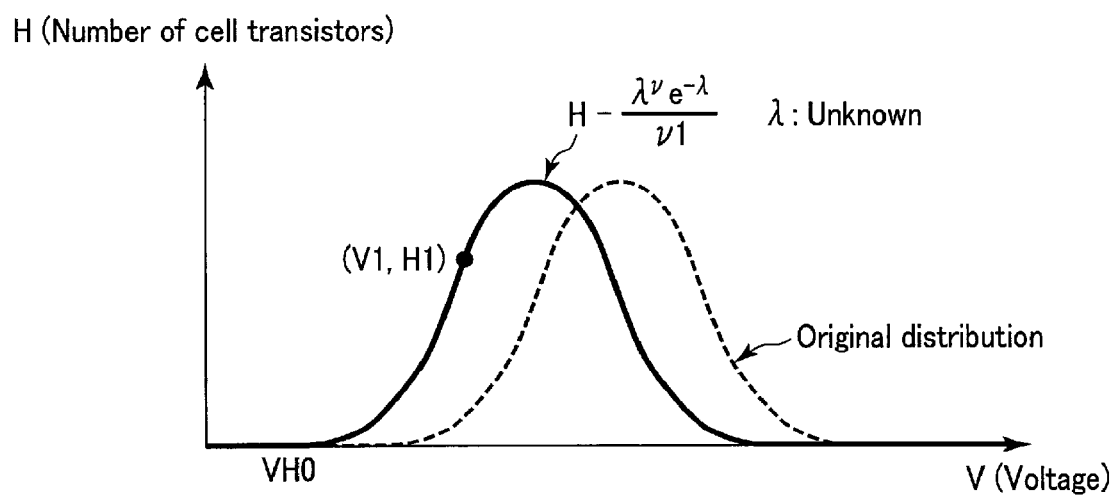
F I G. 15

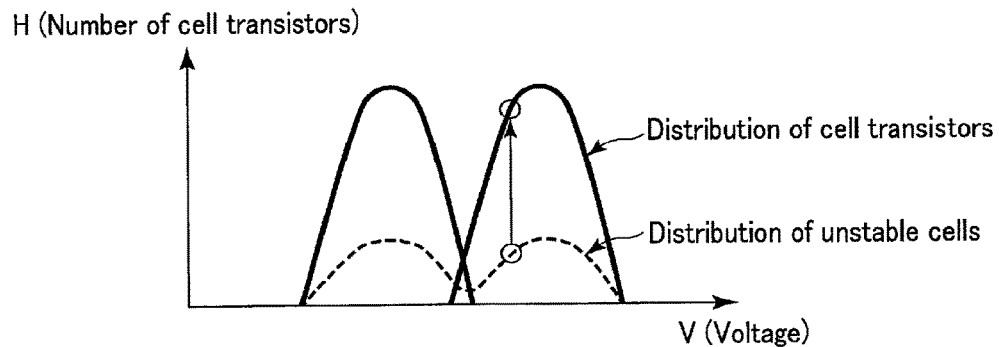
F I G. 17
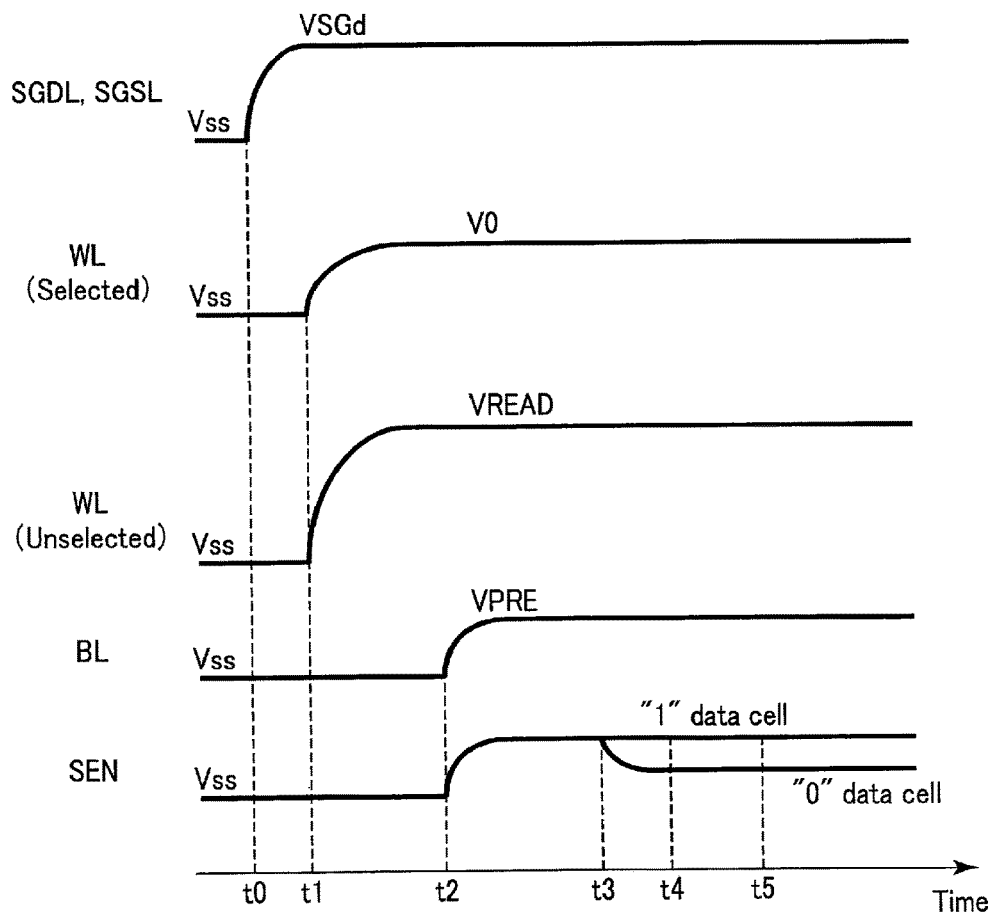
F I G. 18

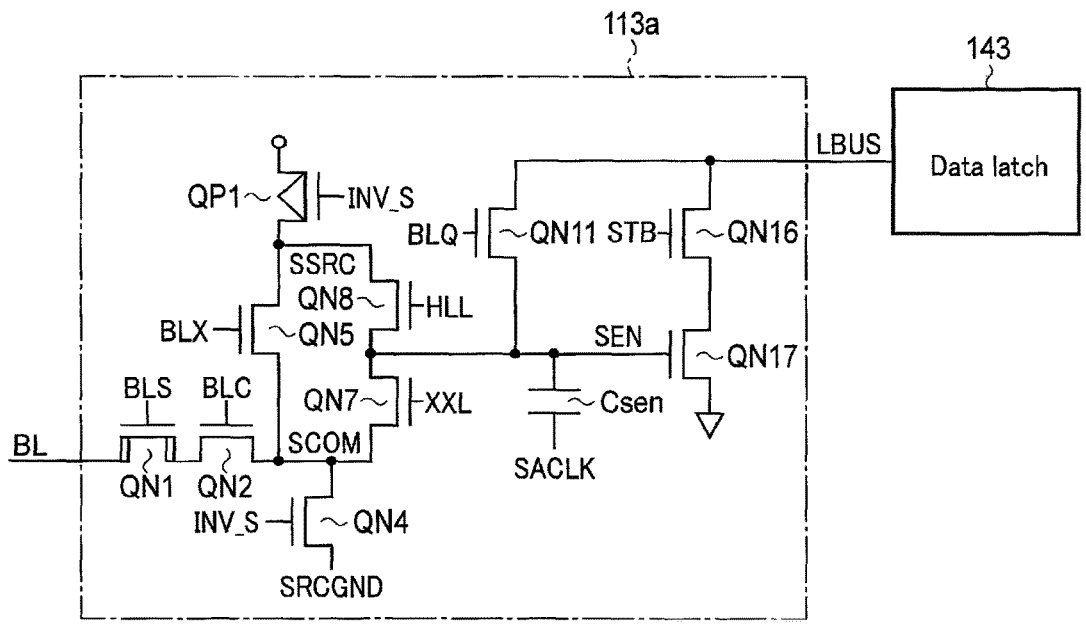
F I G. 19
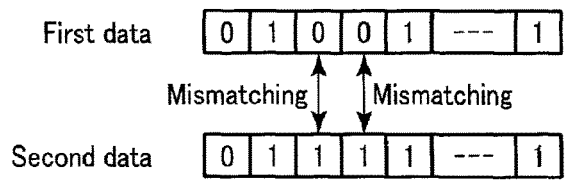
F I G. 20

MEMORY CONTROLLER AND SEMICONDUCTOR MEMORY DEVICE

CROSS-REFERENCE TO RELATED APPLICATIONS

This application claims the benefit of U.S. Provisional Application No. 62/200,892, filed Aug. 4, 2015, the entire contents of which are incorporated herein by reference.

FIELD

Embodiments relate to a memory controller and a semiconductor memory device.

BACKGROUND

A memory device using the threshold voltages of cell transistors to store data and a memory system including such a semiconductor memory device and memory controller are known. The threshold voltage of a cell transistor is adjusted by increasing or decreasing the quantity of electric charge in a layer in the cell transistor, for example.

BRIEF DESCRIPTION OF THE DRAWINGS

FIG. 1 illustrates functional blocks of a memory system of a first embodiment;

FIG. 2 illustrates functional blocks of a memory device of the first embodiment;

FIG. 3 illustrates components and connections of a block of the memory device of the first embodiment;

FIG. 4 illustrates a section of a part of a cell array of the first embodiment;

FIG. 6 illustrates the optimum read voltage and a relation with distribution;

FIG. 11 illustrates a subflow of the read in the memory system of the first embodiment;

FIG. 12 illustrates approximation of a formula describing the curve of a distribution from one point therein in a second embodiment;

FIG. 15 illustrates approximation of another formula describing the curve of a distribution from one point in a distribution in the second embodiment;

FIG. 17 illustrates a relation of a distribution of the number of unstable cells and a distribution of cell transistors in a third embodiment;

FIG. 18 illustrates potentials of some nodes during a read in the third embodiment with time;

FIG. 19 illustrates an example of components and connections of a sense amplifier circuit of the third embodiment;

FIG. 20 illustrates two data items read in the third embodiment;

DETAILED DESCRIPTION

Figure 5:
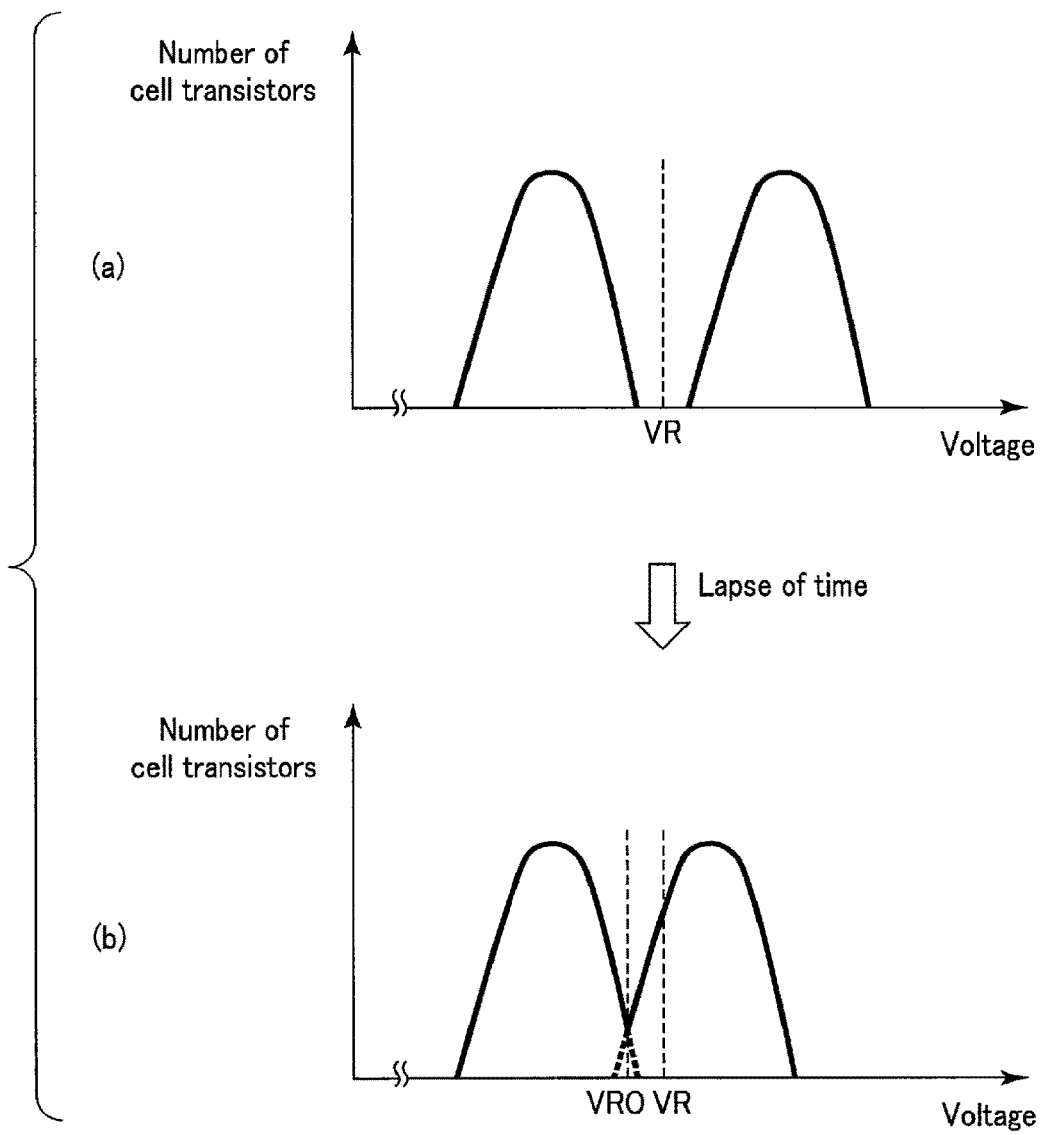
FIG. 5 illustrates a shift of a distribution of threshold voltages with time.

According to one embodiment, a memory controller configured to control a memory device includes: a host interface configured to receive a read command from the outside of the memory controller; and a read controller configured to perform a data read operation on the memory device according to the read command. The read controller performs a data read operation on a set of memory cells of the memory device and determines a first value and a second value. The first value is a number of memory cells having a first threshold voltage among the set of memory cells, and the second value is a number of memory cells having a second threshold voltage among the set of memory cells. The read controller determines a first read voltage based on only the first value and the second value and performs a data read operation on the set of memory cells using the first read voltage.

Embodiments will now be described with reference to figures. In the following description, components with substantially the same functionalities and configurations will be referred to with the same reference numeral, and repeated description is omitted. All descriptions for a particular embodiment are also applicable as descriptions for another embodiment unless stated otherwise. Each functional block can be implemented as hardware, computer software, or combination of the both. It is not necessary that functional blocks are distinguished as in the following examples. For example, some of the functions may be implemented by functional blocks different from those illustrated below. Furthermore, an illustrated functional block may be divided into functional sub-blocks.

Any step in a flow of a method of an embodiment is not limited to any illustrated order, and can occur in an order different from an illustrated order and/or can occur concurrently with another step.

First Embodiment

FIG. 1 illustrates functional blocks of a memory system of a first embodiment. A memory system 1 includes a memory device 100, a memory controller 200, and a host device 300 as illustrated in FIG. 1. The memory device 100 stores data in a nonvolatile manner, and has plural memory cells, and is a NAND flash memory, for example.

The memory controller 200 controls the memory device 100. The memory controller 200 receives commands from the host device 300, and controls the memory device 100 based on the received commands, for example. The controller 200 includes components, such as a processor 210 such as a central processing unit (CPU), a read only memory (ROM) 220, a random access memory (RAM) 230, a memory interface 240, a host interface 250, and an error correction code (ECC) circuit 260.

The controller 200 performs various operations when a program (firmware) stored in the ROM 22 is executed by the processor 210, for example. The RAM 230 stores temporary data, and works as a workspace for the processor 210.

The memory interface 240 is coupled to the memory device 100 via, for example, a bus, such as a NAND bus, and manages communication between the controller 200 and the memory device 100. Some of the functions of the memory interface 240 may be implemented by the program executed by the processor 210. The host interface 250 is coupled to the host device 300 via, for example, a bus, such as a controller bus, and manages communication between the controller 200 and the host device 300. Some of the functions of the host interface 250 may be implemented by the program executed by the processor 210.

The ECC circuit 260 generates an error correction code (or, parity) from data which the ECC circuit 260 received (ECC encoder input) in accordance with a predefined rule for generating error correction code, and outputs the set of the ECC encoder input and the error correction code (or, ECC encoder output). The ECC decoder corrects an error of data which the ECC circuit 260 received based on the error correction code in the data.

The memory device 100 includes components, for example, illustrated in FIG. 2. FIG. 2 illustrates functional blocks of the memory device 100 of the first embodiment. As illustrated in FIG. 2, the memory device 100 includes a core section 110 and a peripheral circuit 140.

The core section 110 includes components, such as a memory cell array 111, a row decoder 112, and a sense amplifier 113.

The cell array 111 includes plural memory cell transistors, and is further provided with interconnects, such as word lines, bit lines, and select gate lines. The cell transistors can store data in a nonvolatile manner. The cell transistors are of a so-called charge-trap type. More specifically, a cell transistor includes a charge storage layer and stores data based on the amount of electric charge in the charge storage layer, which is, for example, an insulator as opposed to a floating electrode, and it holds electrons in defects (traps) in the layer. A material of the insulator is, for example, silicon nitride. An example of the cell transistor with such features includes a metal-oxide-nitride-oxide-semiconductor (MONOS) type transistor or a cell transistor used for a three-dimensional-stack-type cell array, for example.

FIG. 2 illustrates as an example a configuration which the three-dimensional lamination type cell array 111 can have. The cell array 111 includes plural (memory) blocks BLK (BLK0, BLK1, BLK2, . . . ). Each block BLK includes string units SU (SU0, SU1, SU2, . . . ). Each string unit SU includes plural NAND strings NS.

The row decoder 112 selects one block BLK based on a block address received from the controller 200, and applies voltages to the word lines and the select gate lines. During a read of data, the sense amplifier 113 senses data read from the cell transistors, and during a write (program) of data it transfers write data received from the controller 200 to the cell transistors.

The peripheral circuit 140 includes components, such as a sequencer (or, controller) 141, a charge pump 142, a data latch 143, and a driver 144. The sequencer 141 controls operations of the whole memory device 100, especially the charge pump 142 and the driver 144, based on commands received from the controller 200. The sequencer 141 includes a read controller 141a. The read controller 141a manages control of various components in the memory device 100 for data reads in the memory device 100. The sequencer 141 has a function to randomize write data received from the controller 200, and writes them in an instructed page. Specifically, the sequencer 141 can randomize the order of "1" bits and "0" bits in a string of bits in write data and write the bit-order-randomized write data in the memory cells.

The charge pump 142 receives a power voltage from the outside of the memory device 100, and raises the power voltage in accordance with control of the sequencer 141 to generate various voltages (potentials). The generated voltages are supplied to the driver 144 and the row decoder 112. The driver 144 uses the voltages from the charge pump 142 to generate voltages to be applied to the word lines and the select gate lines.

The data latch 143 stores data and has plural latch circuits.

A block BLK has components and connections illustrated in FIG. 3. As illustrated in FIG. 3, each string NS is coupled between a source line SL and a bit line BL. In each string NS, plural cell transistors MT0 to MTn (n being a natural number) are coupled in series, and select gate transistors SDT and SST are coupled to the both ends of the serially-coupled cell transistors MT (MT0 to MTn). The set of cell transistors MT each from one of the strings NS shares one word line WL (WL0, WL1, . . . , or WLn). The gate of each of the select gate transistors SDT in one string unit SU is coupled to a select gate line SGDL (SGDL0 to SGDLk). The gate of each of the select gate transistor SST in the one string unit SU is coupled to a select gate line SGSL (SGSL0 to SGSLk). A read and write of data is performed in units of sets of cell transistors sharing a word line WL (a cell set CS). The memory space of a cell set CS provides one or more pages. Each bit line BL is coupled to a sense amplifier circuit 113a in the sense amplifier 113. Each sense amplifier circuit 113a senses the data of the bit line BL coupled thereto.

An example of the three-dimensional stack type cell array will now be described. For example, the three-dimensional stack type cell array 111 has the structure illustrated in FIG. 4. FIG. 4 illustrates a section of a part of the cell array 111 according to the first embodiment. As illustrated in FIG. 4, a substrate 21 is provided in its surface with a p-type well area 20, on which plural strings NS are provided. Specifically, on the well area 20, interconnect layers 27, interconnect layers 23, and interconnect layers 25 are provided. The interconnect layers 27 serve as a select gate line SGSL. The interconnect layers 23 serve as word lines WL. The interconnect layers 25 serve as a select gate line SGDL.

Over the interconnect layers 25, 23, and 27, sets of a semiconductor (silicon) pillar 31, block insulator 28, charge storage layer (insulator) 29, and gate insulator 30 are provided. The semiconductor pillar 31, the block insulator 28, the charge storage layer 29, and the gate insulator 30 are in contact with the well area 20. The block insulator 28, the charge storage layer 29, and the gate insulator 30 have a cylindrical shape. The block insulator 28 covers the side of the semiconductor pillar 31, the charge storage layer 29 covers the side of the block insulator 28, the charge storage layer 29 covers the side of the block insulator 28, and the gate insulator 30 covers the side of the charge storage layer 29. The semiconductor pillar 31 serves as a current path of the string NS.

Such a structure results in provision of the select gate transistor SST, plural memory cell transistors MT, and select gate transistor SDT on the well area 20 in each string NS.

An interconnect layer 32 is formed on the top of the semiconductor pillar 31. The interconnect layer 32 serves as a bit line BL.

In the area of the surface of the well area 20, an $n^+$-type impurity diffusion layer 33 and a $p^+$-type impurity diffusion layer 34 are provided. The diffusion layer 33 is coupled to the bottom of a contact plug 35, whose top is coupled to an interconnect layer 36. The interconnect layer 36 serves as a source line SL. The diffusion layer 34 is coupled to the bottom of a contact plug 37, whose top is coupled to an interconnect layer 38. The interconnect layer 38 serves as a well interconnect CPWELL. The interconnect layers 36 and 38 are located between the interconnect layers 25 and 32. Two or more sets of components shown in FIG. 4 are arranged along the direction which penetrates the paper on which FIG. 4 is depicted. One string unit SU includes such strings STR which line up along the direction which penetrates the paper.

Referring to FIGS. 5 to 11, operations of the memory system 1 will now be described. First, the principle of estimation of a read voltage on which the operations of the memory system 1 are based is described with reference to FIGS. 5 to 9.

For example, when errors in data read with a default read voltage are uncorrectable, a better read voltage is estimated. Methods of the estimation of the read voltage include various types. A more reliable estimation requires a longer time for the estimation. In contrast, there is also a need for a method which has a relatively lower reliability but can complete in a shorter time. The first embodiment relates to a method of estimation that takes less time.

In general, the threshold voltage of a cell transistor changes with a lapse of time after a data write (to be referred to simply as the time lapse hereinafter), a repetition of erasures and subsequent writes, and a repetition of reads. Among these factors, the threshold voltages of the charge-trap-type cell transistors MT as in the first embodiment are most greatly influenced by the time lapse, and are not influenced so greatly by other factors. Based on this, estimation of a read voltage of the first embodiment is performed with focus on the shift of the threshold voltages due to the time lapse. Furthermore, the estimation of the read voltage of the first embodiment is based on the following observation.

As a result of a write, the threshold voltage of each cell transistor MT has a value according to the stored data. Even if cell transistors MT store the same particular data, they may have different threshold voltages from each other. For this reason, the threshold voltages have a distribution. FIG. 5(a) illustrates an example of distributions of threshold voltages immediately after data is written in cell transistors MT. As illustrated in FIG. 5(a), the distributions are separated from each other. A read of data stored in a cell transistor MT is performed through determination on to which distribution the threshold voltage of this cell transistor MT belongs. The determination of distribution is performed using a read voltage VR between two distributions. A cell transistor MT with a threshold voltage higher than the read voltage VR keeps off to read out "1" data to the sense amplifier 113. In contrast, a cell transistor MT with a threshold voltage lower than the read voltage VR turns on to read out "0" data to the sense amplifier 113.

The threshold voltages of the cell transistors MT may change with a lapse of time after a data write, and, therefore, the positions of the distributions of the threshold voltages on the horizontal axis may shift. As a result of the shift, the distributions may overlap as illustrated in FIG. 5(b). The optimum read voltage for a case of overlapping distributions is the voltage at the position where the two distributions overlap, i.e., a voltage VRO of a point of a minimal of the distribution curve.

The minimal is discovered through searching for the threshold voltage which least cell transistors MT have around the default read voltage. In general, a minimal is located near the voltage at an end of a distribution. Therefore, if an end of a distribution can be estimated, the voltage at the end can be used as the relative minimum. In, for example, cell transistors of a type which accumulates the electric charge in a conductor, such as a floating electrode (to be referred to as FG-type), the difference between the voltage at the minimal and the voltage of a skirt of the distribution is large. This is because the distribution curve of the threshold voltages of the FG-type cell transistors tends not only to extend with time, but to extend more greatly at the lower skirt as illustrated in FIG. 6(a). For this reason, a voltage VRO1 at the minimal of the distribution curve of the threshold voltages of the FG-type cell transistors may include a large error when it is estimated from a voltage EV1 at the lower end of the distribution, as illustrated in FIG. 6(a).

In contrast, the distribution of the threshold voltages of the charge-trap-type cell transistors, as with those in the first embodiment, has a feature in which the whole distribution shifts in the direction of the lower voltage while maintaining the shape immediately after the write with time, as illustrated in FIG. 6(b). For this reason, the difference of a voltage EV2 at the lower end of the distribution and a voltage VRO2 at a relative minimum is small as illustrated in FIG. 6(b). Therefore, for the charge-trap-type cell transistors, the voltage at the lower end of one of the two overlapping distributions can be used as a better read voltage for determination of one of the two distributions more reliably than the case in the FG-type cell transistors.

Based on the above knowledge about the charge-trap-type cell transistors, the memory system of the first embodiment uses the following estimation of a read voltage.

Figure 7:
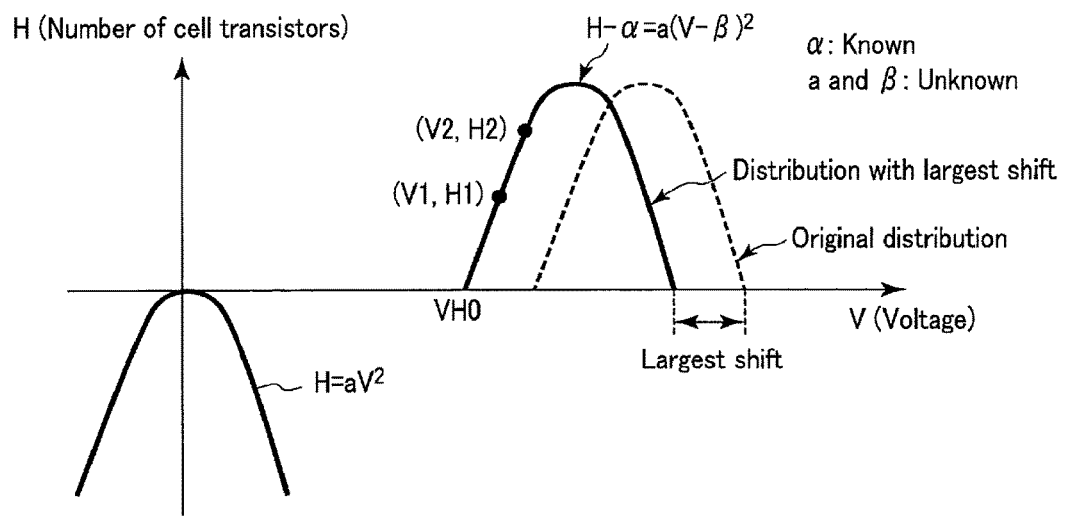
FIG. 7 illustrates approximation of a formula describing the curve of a distribution from two points therein in the first embodiment.
Figure 8:
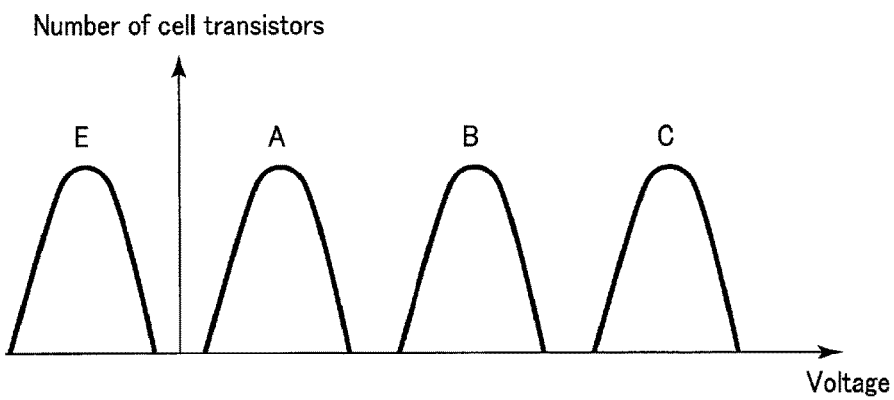
FIG. 8 illustrates an example of arrangement of distributions.

FIG. 7 illustrates the principle of the estimation of a better read voltage in the first embodiment. As described above, the voltage at the lower end of one of two overlapping distributions (one with higher voltages) is estimated. To this end, a formula describing the shape of the distribution is approximated to be expressed by the quadratic curve $H=aV^2$. The value V is the threshold voltage and the value H is the number of the cell transistors MT. Such a quadratic curve has a symmetry (line symmetry) shape. The distribution of each level is in line along the x-axis (or, the axis of voltage) as in FIG. 8. The write data has its bit order randomized, and therefore each distribution of a level includes almost the same number of cell transistors MT and has a similar shape with only a difference in positions on the x-axis. E, A, B, and C in the figure refer to the distributions.

Referring back to FIG. 7, when the quadratic curve $H=aV^2$ is moved in the HV-plane, it is expressed by $$H-\alpha=a(V-\beta)^2 \qquad (1).$$

The maximum numbers of cell transistors MT in respective distributions are also almost the same, and therefore they can be estimated from the number of cell transistors MT in one cell set CS. Therefore, $\alpha$ is known. For this reason, in the formula (1), only constants $\alpha$ and $\beta$ are unknown. In order for the constants $\alpha$ and $\beta$ to be determined, the coordinates of two points in the distribution, i.e., (V1, H1) and (V2, H2) are required. To this end, the respective numbers of cell transistors MT with the two threshold voltages at two points are determined. The two points are selected so that the following conditions should be fulfilled.

First, the two points are at different positions in the slope on the left-hand side of the focused distribution, i.e., in a range of voltage lower than the threshold voltage which most cell transistors MT have. In order for such two points to be selected while the amount of the shift of the threshold voltage distribution due to the time lapse is unknown, the shift amount is assumed to be smaller than a particular maximum amount. The maximum amount can be determined in advance based on, for example, a specification of the memory device 100. Specifically, the maximum amount can be based on, among items of the specification, a continuous time lapse without power supply. The continuous time lapse without power supply refers to a continuous time for which the memory device 100 can hold data without power.

For example, based on an assumption that the maximum shift amount is equal to or lower than a third of the width of the distribution, the points to be selected only need to be in the range of a sixth from the lower end (left-hand side end) of the original distribution (or, immediately after a write). Substituting the values H and V at thus-selected two points in the formula (1) determines the constants a and β. In this way, the distribution curve expressed by the formula (1) with determined constants α and β is estimated, and the voltage corresponding to one point on the distribution curve in a part which includes the lower end (or, a skirt of the curve) can be used as a read voltage. For example, the one point is the left end, i.e., the point at which the value H is zero. Alternatively, the one point is a point larger than the distribution's left-hand side end by 1% of the width of the distribution. This is based on the capability of the ECC circuit 260, i.e., the ECC circuit 260's correctable number of bits in data of a size of a unit processed by the ECC circuit 260. FIG. 7 illustrates the voltage VH0 at the point where the value H is zero.

Figure 9:
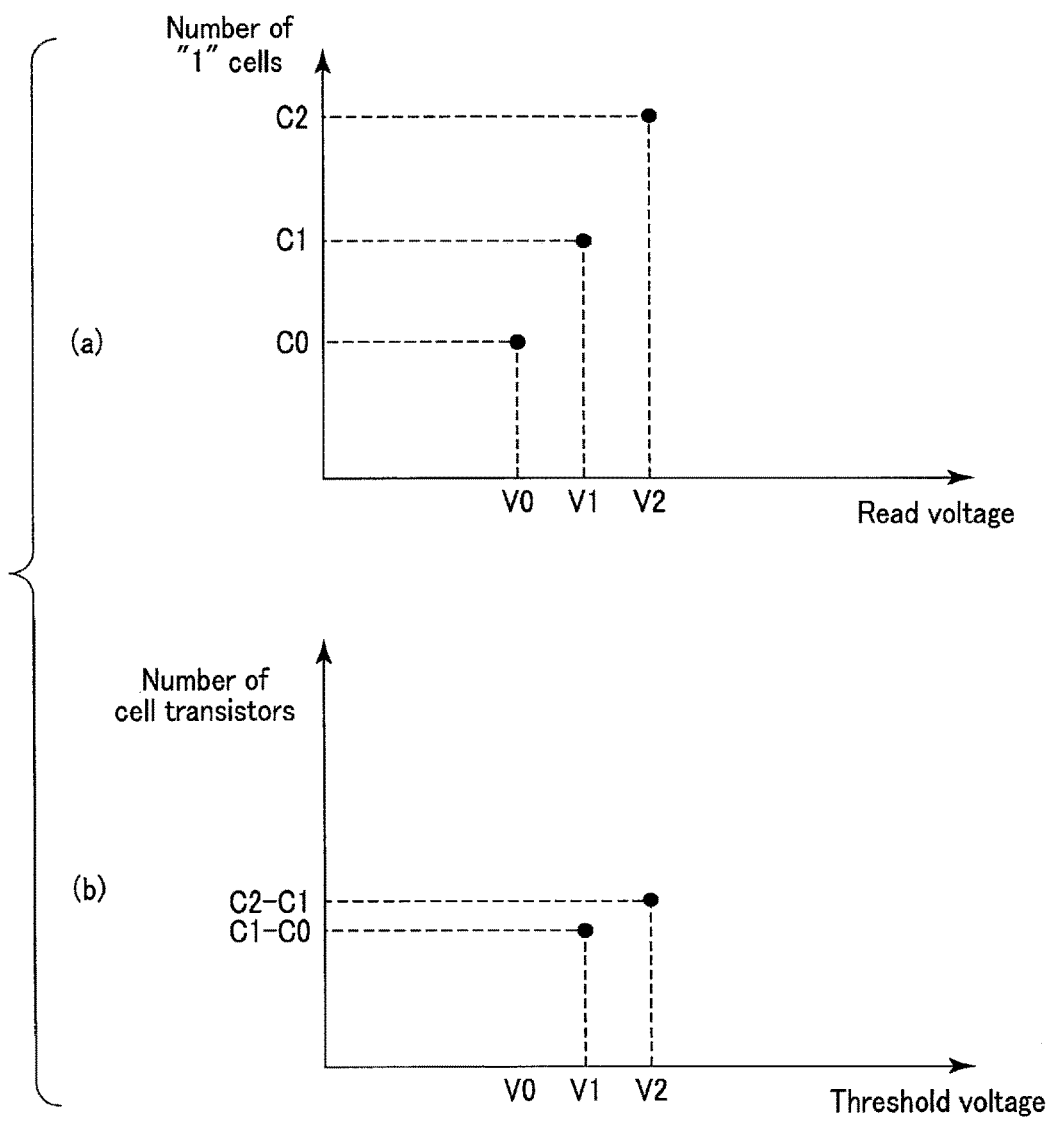
FIG. 9 illustrates determination of two points in a distribution in the first embodiment.

In order to determine the two points (or, two relations between particular threshold voltages and the numbers of cell transistors with those threshold voltages) for determining the constants α and β, a total of three reads with voltages V0, V1, and V2 only needs to be performed as illustrated in FIG. 9(*a*). Specifically, two reads are required to determine each point, the two read voltages V0 and V1 are used to determine the first point, and the voltage V1 of them both is used for determining the second point, which requires only one read for determining the second voltage. Then, the numbers of the cell transistors C1, C2, and C3 storing "1" data at the respective voltages V0, V1, and V2 are determined. Subsequently, as illustrated in FIG. 9(*b*), the number of the cell transistors MT with the threshold voltage V1 is calculated as the value C1-C0, and that with the threshold voltage V2 is calculated as the value C2-C1.

The description so far is based on the example where a better read voltage is estimated based on the lower end of the larger one of two adjacent distributions (levels). The read voltage may be estimated based on the larger end of the smaller one of the distributions. In this case, the two points (V1, H1) and (V2, H2) are selected in a range of voltage larger than the threshold voltage of most cell transistors MT. In other words, the two points are selected from the slope on the right side of the peak of the distribution.

A description will now be given of an example of a specific operation of the memory system 1 based on the above principle. Specifically, estimation of a better read voltage by the controller 200 will be described. The controller 200 is configured to perform the operations described in the following. In other words, the controller 200 performs the operations described in the following when a program in the ROM 220 is executed by the processor 210.

Figure 10:
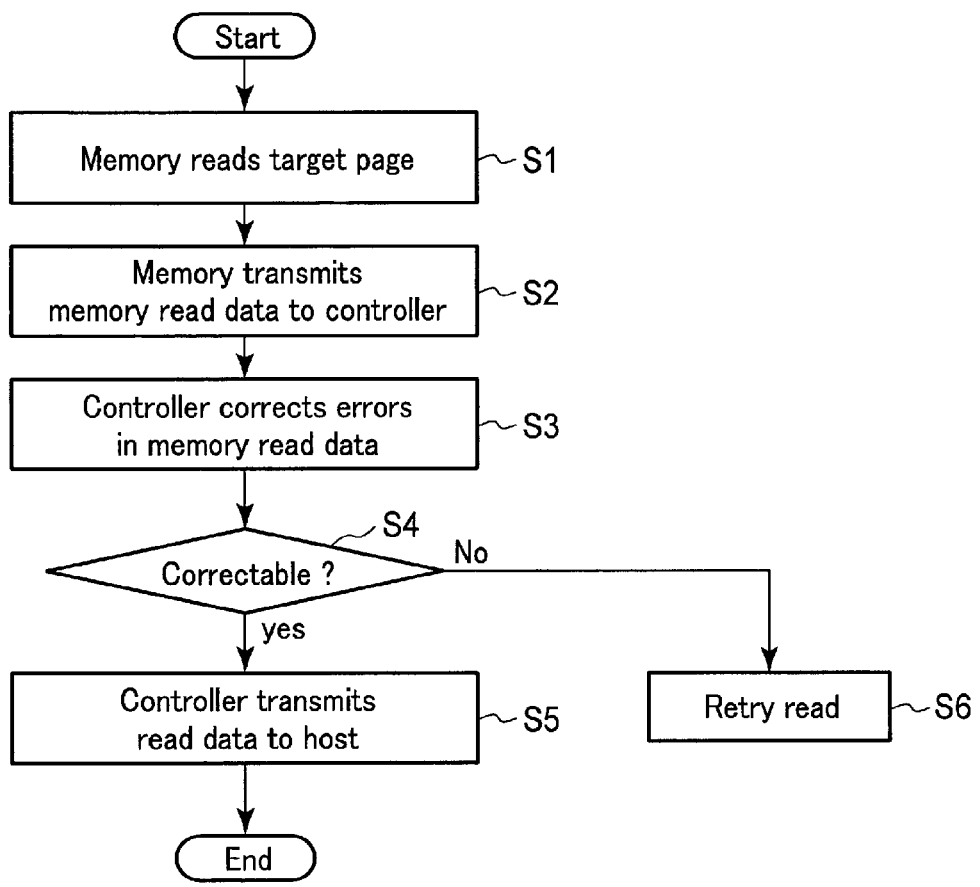
FIG. 10 illustrates the flow of a read in the memory system of the first embodiment.

FIG. 10 illustrates the flow of a read in the memory system of the first embodiment. First, based on a command from the host device 300, the controller 200 transmits to the memory device 100 a command to instruct to read data from a particular page (step S1). This command instructs the use of the default read voltage. When the memory device 100 receives the command, it reads data from the cell set CS which provides the memory space of the read-target page, and transmits the read data as memory read data to the controller (step S2). The memory read data includes the set of substantial data (or, user data) and the parity.

The controller 200 uses the ECC circuit 260 to try to correct errors in the substantial data in the memory read data (step S3). The controller 200 determines whether errors were correctable (step S4). When the errors were correctable or when there was no error, the flow shifts to step S5. In step S5, the controller 200 transmits the error-corrected substantial data as read data to the host device 300, and the flow ends.

In contrast, when the errors were uncorrectable in step S4, the threshold voltages of some cell transistors MT in the cell set CS which has the read-target page could have shifted to result in failure of the read from the read-target page with the default read voltage. Based on the impossibility of correction of the errors, the controller 200 performs a retry read in step S6. In the retry read, the controller 200 estimates a better read voltage based on the principle described with reference to FIGS. 5 to 10, and uses the estimated read voltage to perform a read. The subflow of the retry read in step S6 is illustrated in FIG. 11.

The controller 200 first determines the number of the cell transistors MT with a threshold voltage V1 among the cell transistors MT in the read-target cell set CS by steps S11 to S17. The voltage V1 is the voltage corresponding to the point (V1, H1) of FIG. 7. For the determination, the controller 200 transmits to the memory device 100 a command which instructs a read from the read-target cell set CS with a read voltage V0 (step S11). The voltage V0 is smaller than the voltage V1.

When the memory device 100 receives the command, it uses the read voltage V0 to read data from the read-target cell set CS (step S12). The string of "1" data and "0" data from the cell set CS (data D0) is transmitted to the controller 200 from the memory device 100 (step S13). The controller 200 stores the data D0 in the RAM 230.

The controller 200 performs steps S14 to S16. The steps S14 to S16 are the same as steps S11 to S13 respectively with only a difference in read voltage. The data resultant of step S16 is referred to with data D1.

In step S17, the controller 200 subtracts the number of the "1" data (bits) in the data D0 from the number of the "1" data in the data D1, and stores the result as a value H1 in the RAM 230.

The controller 200 then determines the number of the cell transistors MT with a threshold voltage V2 among the cell transistors MT in the read-target cell set CS by steps S21 to S24. The details are similar to steps S11 to S17. Specifically, the controller 200 calculates a difference H2 between the number of "1" data in data D2 which were read with the read voltage V2 (>V1) and the number of the "1" data in the data D1.

In step S31, the controller 200 substitutes the values (V1, H1) and (V2, H2) in the formula (1) to determine constants a and β. The controller 200 then uses the formula (1) with the determined constants a and β to determine one point (for example, end) in the lower skirt of the distribution, and calculates a voltage VH0 corresponding to this determined one point, or the voltage VH0 at the point where the distribution curve intersects the horizontal axis. For example, the controller 200 calculates the value VH0 at which the value H is zero from the formula (1) with the determined constants a and β.

The controller 200 then transmits to the memory device 100 a command which instructs a read from the read-target cell set CS with the read voltage VH0 (step S32).

When the memory device 100 receives the command, it uses the read voltage VH0 to read data from the read-target cell set CS (step S33), and transmits the read data (retry read data) to the controller 200 (step S34). When the controller 200 receives the retry read data, it uses the ECC circuit 260 to correct errors of the substantial data in the retry read data (step S35).

The controller 200 determines whether errors were correctable (step S36). When the errors were correctable, or when there was no error, the flow shifts to step S5 of FIG. 10, and otherwise the flow shifts to step S37. In step S37, the controller 200 notifies a read fail to the host device 300. Alternatively, the controller 200 may perform an additional retry read after the No branch of step S36. The additional retry read involves a method which takes more time than but estimates a better read voltage than the retry read of FIG. 11.

As described, according to the first embodiment, the controller 200 estimates the curve of a threshold voltage distribution from the number of the cell transistors MT with a first threshold voltage and that with a second threshold voltage. From the estimated distribution curve, especially based on the voltage at the lower end of the distribution curve, the controller 200 estimates a better read voltage. The numbers of the cell transistors MT with respective two threshold voltages can be determined through three reads with different voltages. This allows a better read voltage to be estimated in a short time.

Second Embodiment

The second embodiment relates to estimation of a better read voltage as in the first embodiment, and is based on estimation similar to that of the first embodiment.

The memory system 1 of the second embodiment includes the same devices as the first embodiment (FIG. 1); however, the controller 200 and the memory device 100 are configured to perform the operation described in the following.

The operations of the memory system 1 will be described with reference to FIGS. 12 to 16. First, a description will be given of the principle of estimation of a better read voltage on which the operations of the memory system 1 of the second embodiment are based with reference to FIGS. 12 to 13.

The estimation of the read voltage of the second embodiment takes the change of the threshold voltages of the cell transistors MT by the time lapse into account as in the first embodiment. In addition, in the second embodiment, the known constant a is used in a formula (1), and as a result only constant β is unknown. The constant a is determined in advance by, for example, experiment and/or simulation. Specifically, distribution curves are determined several times and the average of the plural values a approximated from the curves is used, for example. In order for the constant β to be determined, the coordinates of one point in the distribution, i.e., (V1, H1), is only necessary as illustrated in FIG. 12. Because of this, as described in the first embodiment, the number of cell transistors MT with the threshold voltage V1 is determined, and the values V1 and H1 are substituted in the formula (1) to determine β. Note that the constant β may be one of two values, and the negative constant β is adopted. This is because the threshold voltage can only be one of the two based on the only possible shift in the negative direction with time.

Figure 13:
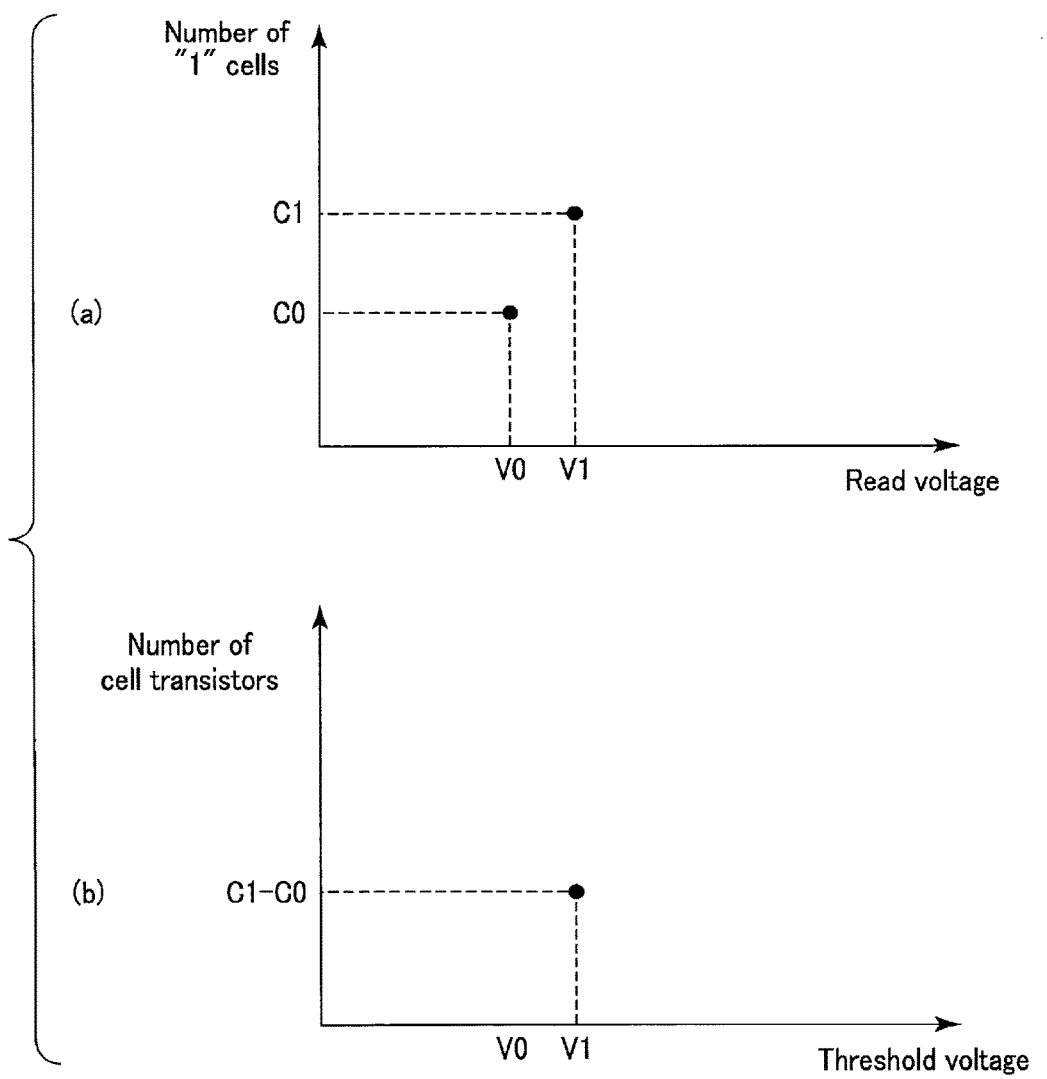
FIG. 13 illustrates determination of one point in a distribution in the second embodiment.

In this way, the distribution curve expressed by the formula (1) with the determined constant β is estimated, and the voltage corresponding to one point in the lower skirt in that distribution curve is used as the read voltage as in the first embodiment. In order to determine one point for determining the constant β, a total of two reads with the voltages V0 and V1 only need to be performed. Specifically, as illustrated in FIG. 13(*a*), the numbers C0 and C1 of the cell transistors with "1" data with respective two read voltages V0 and V1 are determined. The number H1 of the cell transistors MT with the threshold voltage V1 is then calculated as the value C1-C0 as illustrated in FIG. 13(*b*).

A description will now be given of an example of specific operations which are based on the above principle. Specifically, a description will be given of a method to estimate a better read voltage by the controller 200, which is configured to perform the operations described in the following.

Figure 14:
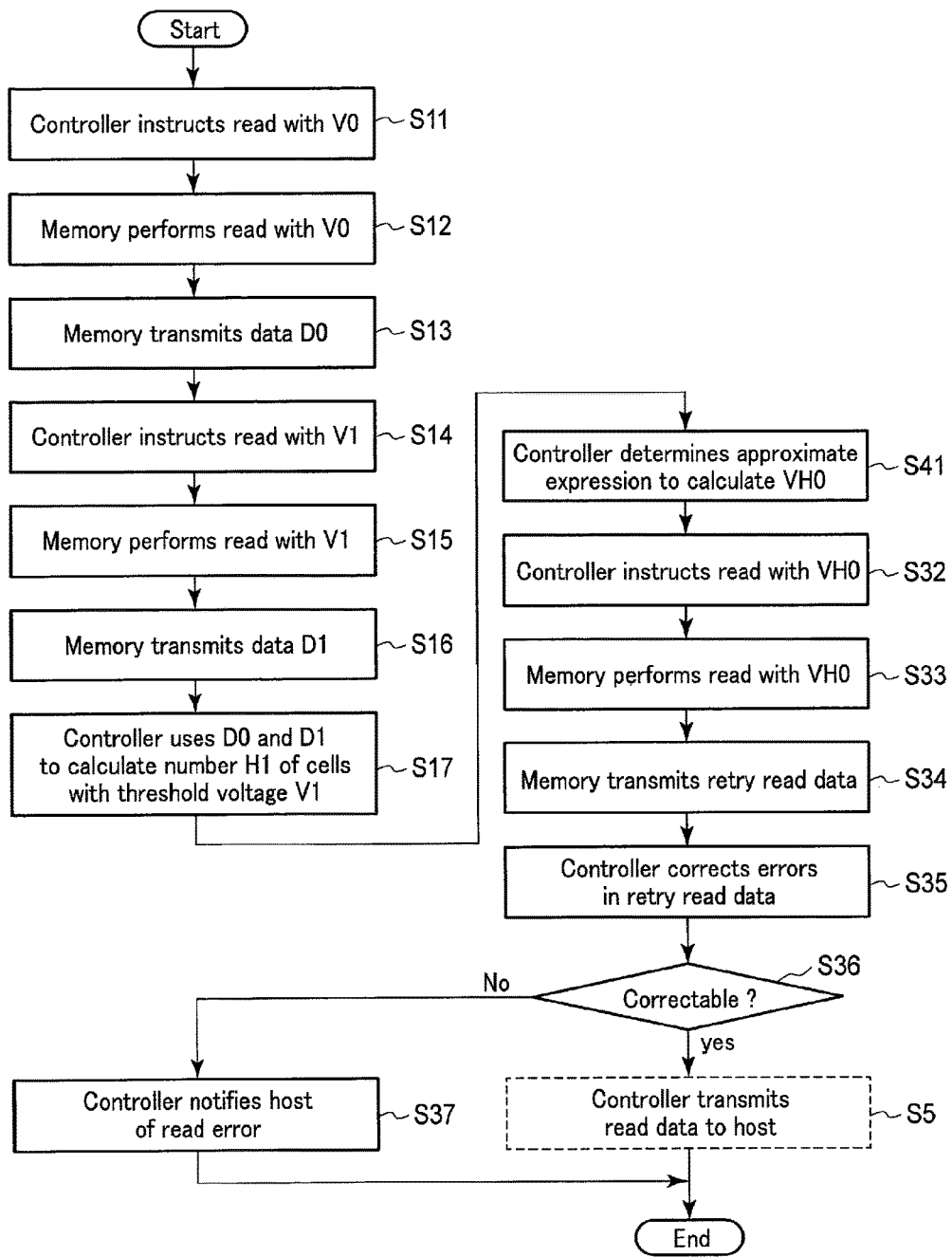
FIG. 14 illustrates a subflow of a read in a memory system of a second embodiment.

The read of the second embodiment follows the flow of the FIG. 10 of the first embodiment. In contrast, in the second embodiment, the flow of the retry read in FIG. 10 (step S6) differs from that in the first embodiment and performs a subflow illustrated in FIG. 14 as step S6. FIG. 14 illustrates the subflow in the flow of read of the second embodiment.

The FIG. 14 flow differs from FIG. 11 flow in that steps S21 to S24 are replaced by step S41. Specifically, step S17 continues at step S41. In step S41, the controller 200 substitutes the value (V1, H1) in the formula (1) to determine the constant β. Note that, in the second embodiment, the constant a is known as opposed to the first embodiment. Therefore, using one set of the values V1 and H1 can determine all the unknowns, i.e., the constant β.

The controller 200 then uses the formula (1) with the determined constant β to determine one point (for example, end) in the lower skirt of the distribution, and determines a voltage VH0 corresponding to this determined one point, or the voltage VH0 at the point where the distribution curve intersects the horizontal axis. For example, the controller 200 calculates the value VH0 with which the value H is zero from the formula (1) with the determined constant β. Step S41 continues at step S32.

The distribution may be assumed to follow a particular probability distribution, instead of the quadratic curve. An example of the probability distribution is Poisson distribution. Poisson distribution is represented by formula (2).

$$p_v = \frac{\lambda^v e^{-\lambda}}{v!}. \tag{2}$$

pv is the probability for v, λ is the average of v, and e is a base of a natural logarithm. The value λ specifies the position of the distribution on the v-axis. The formula (2) is applied to the relation of the number H of the cell transistors MT with the threshold voltage V, then a formula (3) is obtained.

$$H = \frac{\lambda^V e^{-\lambda}}{V!}. \tag{3}$$

Using the values V1 and H1 of the one determined point in the distribution can determine the constant λ from the formula (3), and the formula (3) with the determined constant λ can determine the voltage VH0 with which the value H is zero.

Figure 16:
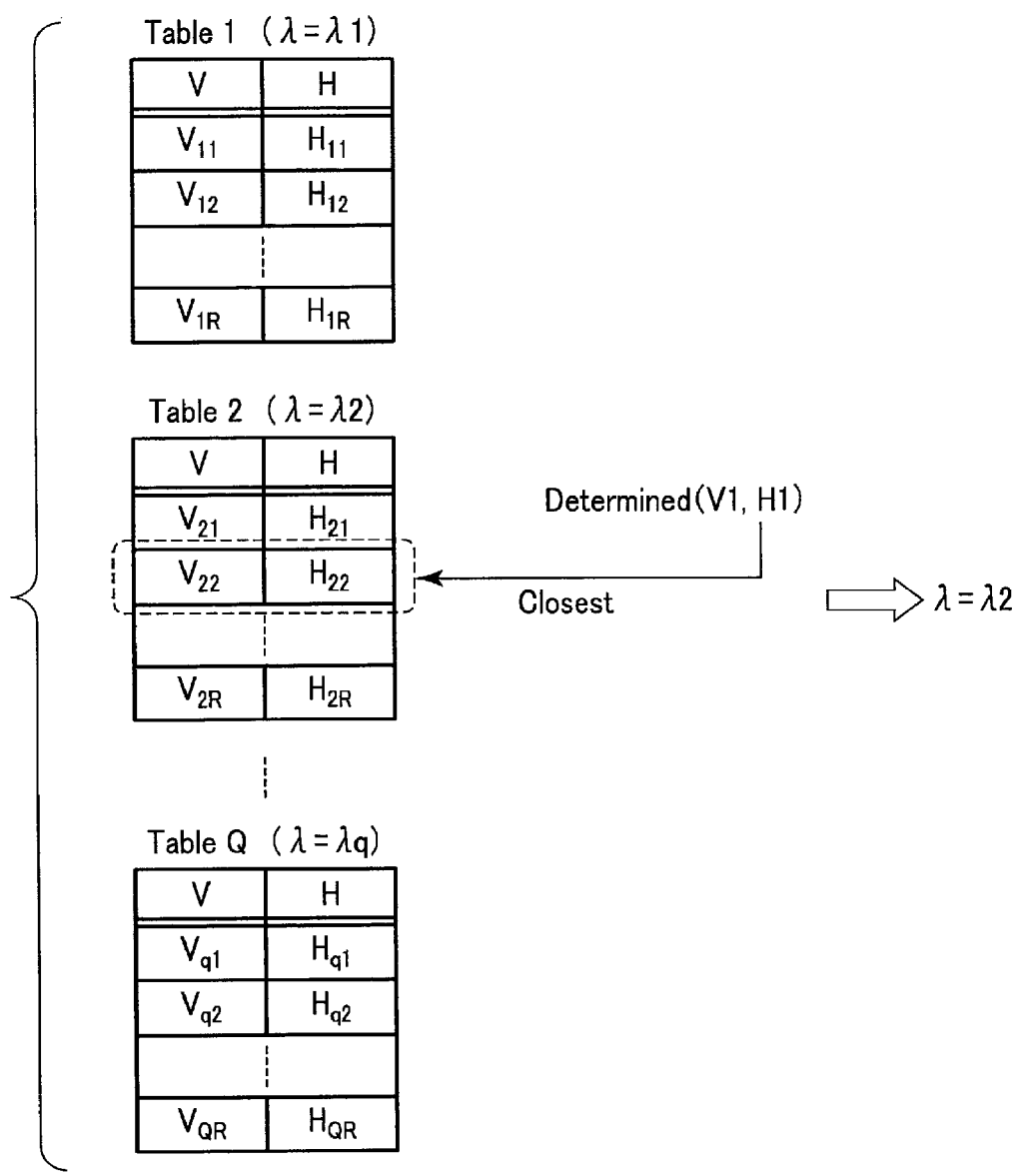
FIG. 16 illustrates determination of unknowns in the memory system of the second embodiment.

The calculation to calculate such a value VH0 is complicated, and therefore the value VH0 may be determined with a table. Specifically, as illustrated in FIG. 16, the controller 200 stores the table 1 to table Q which indicate, for various values of λ, plural values V and values H corresponding to the values V, where Q is a natural number. The controller 200 selects a table including a set (V, H) closest to the determined set (V1, H1), for example (V22, H22), such as table 2. The controller 200 then uses the formula (3) including the constant λ in the selected table to calculate the value VH0 with which the value H is zero. Alternatively, each table may include the voltage VH0, and the voltage VH0 corresponding to the selected table may be merely selected.

The specific flow is the same as the flow of FIG. 14, and only differs from the method described above about step S41 for how to determine the value VH0 in step S41.

As described, according to the second embodiment, the controller 200 estimates the curve of a threshold voltage distribution from the number of the cell transistors MT with a particular threshold voltage. From the estimated distribution curve, especially based on the voltage at the lower end of the distribution curve, the controller 200 estimates a better read voltage. The number of the cell transistors MT with a particular threshold voltage can be determined through two reads with different voltages. This allows the better read voltage to be estimated in a short time.

Third Embodiment

The third embodiment is based on the first embodiment, but differs from the first embodiment in the method used to count cell transistors MT with a particular threshold voltage.

The memory system 1 of the third embodiment includes the same devices as the first embodiment (FIG. 1); however, the controller 200 and the memory device 100 are configured to perform the operations described in the following.

The operations of the memory system 1 will be described with reference to FIGS. 17 to 22. First, a description will be given of the principle of counting of cell transistors with a particular threshold voltage on which the operations of the memory system are based with reference to FIGS. 17 to 22.

In general, when a particular read voltage is used to read data from cell transistors and the threshold voltages of the cell transistors are separated from the read voltage enough (or, a read margin is large), it can be determined for sure whether the threshold voltages are higher or lower than the read voltage. The read margin has a sufficient quantity immediately after a write. In other words, a memory device performs a write to form between threshold voltage distributions a large interval which allows for a sufficient read margin immediately after the write. However, when a voltage at a minimal of a distribution curve is used as the read voltage due to a lapse of time after the write, this produces a situation where data is read from cell transistors with threshold voltages near the read voltage. This means a read with little or no read margin. The data read in this way do not always have the same values every read, and varies in every read due to a few factors, such as random telegraph noise.

Thus, a cell transistor which outputs such unstable data has a threshold voltage near the read voltage. Therefore, the more cell transistors with unstable read data with a particular read voltage over several times there are, the more cell transistors with the threshold voltage equal to that particular read voltage there are. In other words, as illustrated in FIG. 17, it can be assumed that the number of cell transistors which output data unstably with a particular read voltage (or, unstable cells or unstable cell transistors) correlates with the number of cell transistors with the threshold voltage equal to that particular read voltage.

Using this correlation, unstable cells (bits) for a particular read voltage are counted, and based on this count the number of cell transistors with the threshold voltage equal to the that read voltage is estimated.

The calculation of the unstable cells is performed with the method described in the following with reference to FIG. 18. FIG. 18 illustrates potentials of some nodes during a read in the third embodiment with time. FIG. 18 illustrates a node SEN in the sense amplifier circuit 113a. The node SEN is a node which exhibits the potential which varies based on the threshold voltage of a read-target cell transistor MT, and is coupled to a component illustrated in, for example, FIG. 19. FIG. 19 illustrates an example of components and connections of a sense amplifier circuit 113a of the third embodiment.

As illustrated in FIG. 19, the bit line BL is coupled to a node SCOM through serially coupled n-type MOSFETs QN1 and QN2. The transistors QN1 and QN2 receive at their gates signals BLS and BLC from the sequencer 141, respectively. The signal BLS controls connection of the bit line BL and the sense amplifier 113a. The signal BLC controls the potential to which the potential of the bit line BL is clamped.

The node SCOM is coupled to a node SRCGND through an n-type MOSFET QN4. The transistor QN4 receives at its gate a signal INV_S from the sequencer 141. The node SRCGND has the ground potential VSS.

The node SCOM is also coupled to a power potential node (or, node of the power potential VDD) through an n-type MOSFET QN5 and a p-type MOSFET QP1, which are coupled in series. The transistors QN5 and QP1 receive at their gates signals BLX and INV_S from the sequencer 141, respectively. The node SCOM is further coupled to the node SEN through an n-type MOSFET QN7. The transistor QN7 receives a signal XXL from the sequencer 141 at the gate.

The node SEN is coupled through an n-type MOSFET QN8 the node SSRC between the transistors QN5 and QP1. The transistor QN8 receives a signal HLL from the sequencer 141 at the gate. The node SEN also receives a signal SACLK through a capacitor Csen. The node SEN is further coupled to a node LBUS through an n-type MOSFET QN11. The transistor QN11 receives a signal BLQ from the sequencer 141 at the gate.

The node LBUS is coupled to a data latch 143. The node LBUS is also grounded through n-type MOSFETs QN16 and QN17, which are coupled in series. The transistor QN16 receives a signal STB from the sequencer 141 at the gate. The transistor QN17 is coupled to the node SEN at the gate.

During a read, the signals BLS, BLC, and BLX are made high, and the node INV_S is made low. This precharges the bit line BL. Moreover, the signal HLL is made high to charge the capacitor element Csen, which increases the potential of the node SEN.

Subsequently, the signal HLL is made low and the signal XXL is made high, which starts the sense. If the read-target cell transistor MT is turned on to allow a cell current to flow into the source line SL from the bit line BL, the node SEN is discharged to decrease the potential of the node SEN. In contrast, if the cell transistor MT keeps off, the node SEN is not discharged and substantially maintains the original potential.

The signal STB is then made high to strobe the data. In other words, the read data is transferred to the data latch 143. Specifically, if the potential of the node SEN is high, the transistor 17 turns on to allow the "L" level to be transferred to the data latch 143 through the node LBUS. In contrast, if the potential of the node SEN is low, the transistor 17 keeps off to allow the node LBUS to remain high, which is the initial state. Therefore, the data latch 143 stores "H" level.

Referring back to FIG. 18, at the time t0, the sequencer 141 makes the select gate lines SGDL and SGSL a potential VSGd in the string unit (or, selected string unit) SU which includes the read-target cell set CS. The potential VSGd has a magnitude which turns on the transistors SDT and SST.

At the time t1, the sequencer 141 starts to raise the potential of the word line (or, selected word line) WL coupled to the read-target cell set CS to a read potential V0. The read potential V0 is the same as the threshold voltage which the cell transistors MT to be counted have, or, in a subsequent process the number of the cell transistors MT which have the threshold voltage V0 will be determined. At the time t1, the sequencer 141 further starts to raise the potentials of the word lines WL other than the selected word line WL in the selected string unit SU to a voltage VREAD. The voltage VREAD has a magnitude which turns on any cell transistor MT regardless of its threshold voltage. A time is taken for the word lines WL to rise to the voltage V0 or VREAD.

From the time t2, the sequencer 141 precharges the bit line BL to a potential VPRE. Moreover, the sequencer 141 couples each bit line BL to the node SEN in the sense amplifier circuit 113a coupled to that bit line BL, and, therefore, the potential of the node SEN rises to the same potential as the bit line BL.

Once the potentials of the word lines WL rise to the potential V0 or VREAD, the sequencer 141 starts the sense with the sense amplifier 113 at the time t3. When the sense starts, the potential of the node SEN falls or remains the same in accordance with the state of the cell transistor MT coupled to the bit line coupled to the node SEN. Specifically, the application of the potential V0 turns on the cell transistors MT with the threshold voltage lower the potential V0, and maintains the cell transistors MT with the threshold voltage equal to or higher than the potential V0 off. The potential of the node SEN electrically coupled to the turned-on cell transistor MT falls, whereas the potential of the node SEN electrically coupled to the cell transistor MT remaining off does not fall. However, among the cell transistors MT coupled to the word line WL, that with the threshold voltage of the magnitude near the potential V0 can conduct a current of the magnitude between the magnitude of the current it conducts when it is on and that it conducts when it is completely off. This can result in the potential of the node SEN having a magnitude near the threshold voltage of the transistor QN17. The transistor QN17 in turn can conduct a current of a magnitude with which the bus LBUS cannot be clearly determined to be high or low. Therefore, the value taken into the data latch 143 is also indefinite, or it may have instability and vary according to the state.

Once the potential of the node SEN is settled, at the time t4 the sequencer 141 controls the sense amplifier 113 to sense the potentials of the nodes SEN, and takes into the data latch 143 the set of the bits which indicates the result of the sense for the nodes SEN (first data), or it strobes first data. The first data is made of a bit string of the size of one page, and is transmitted to the controller 200 from the data latch 143.

At the time t5, the sequencer 141 controls the sense amplifier 113 again to sense the potentials of the nodes SEN, and takes into the data latch 143 the set of the bits which indicates the result of the sense for the nodes SEN (second data). The second data also has the size of one page, and is transmitted to the controller 200 from the data latch 143. Up to the time t5, the word lines WL, the select gate lines SGDL and SGSL, and the bit lines BL are maintained at the states the same as those at the time t4.

The second data may not be the same as the first data due to various factors, such as variation in the state in the process of the sense, and a noise, as described above. The controller 200 compares the first data and second data between corresponding bits to count different bits as illustrated in FIG. 20.

A description will now be given of an example of a specific operation which is based on the above principle. Specifically, a description will be given of a method to estimate a better read voltage by the controller 200, which is configured to perform the operations described in the following.

Figure 21:
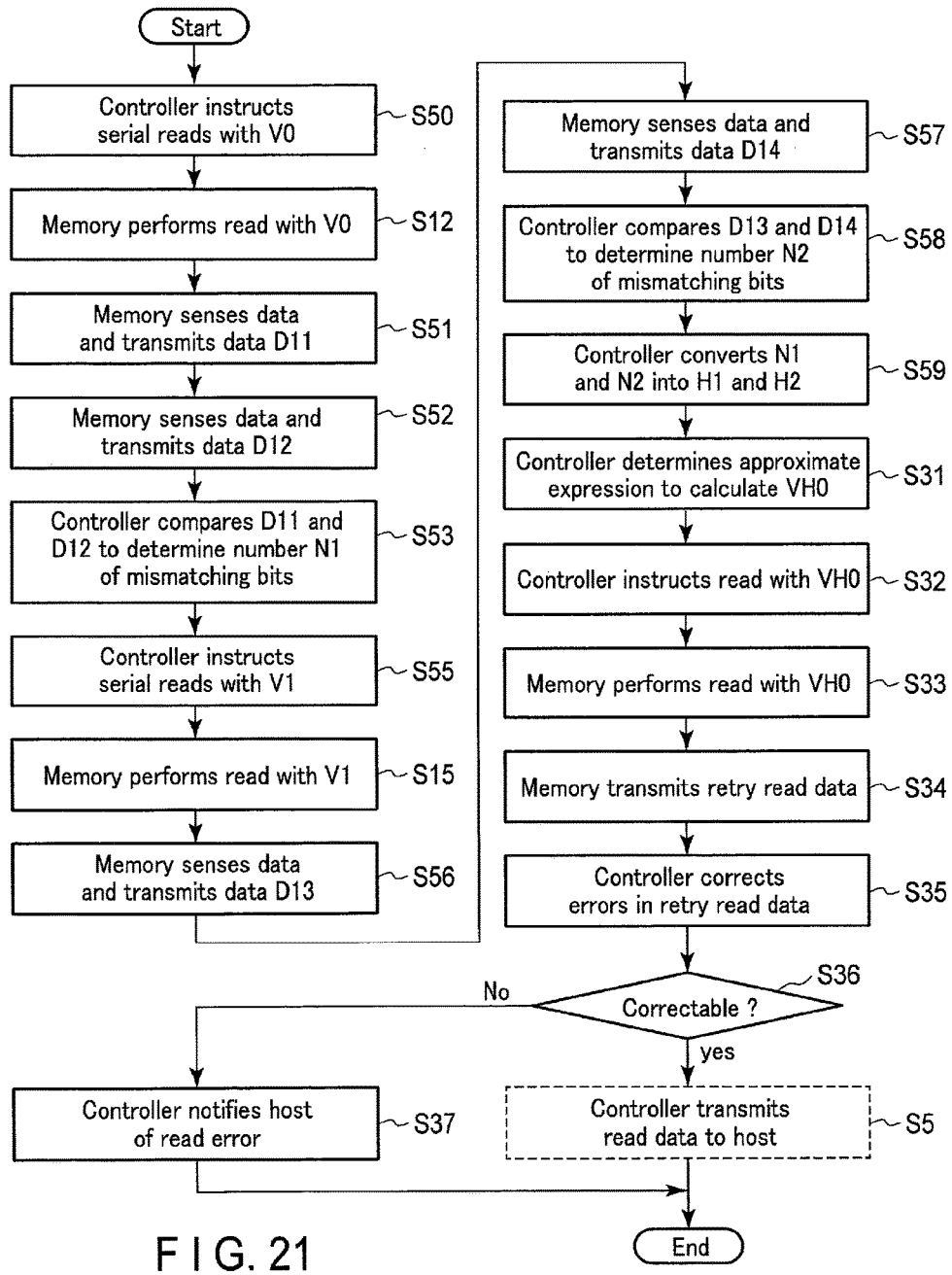
FIG. 21 illustrates a subflow in a flow of a read in the third embodiment.

The read of the third embodiment follows the flow of the FIG. 10 of the first embodiment. In contrast, in the third embodiment, the flow of the retry read (step S6) differs from that in the first embodiment and performs a subflow illustrated in FIG. 21 as step S6. FIG. 21 illustrates the subflow in the flow of read of the third embodiment.

As illustrated in FIG. 21, the controller 200 transmits a command which instructs serial reads using the read voltage V0 (step S50) to the memory device 100. The command which instructs the serial reads instructs plural (two, for example) reads (latching) of data while maintaining the states of the interconnects in the memory device 100 set up for a read, and transmission of the same to the controller 200. The command instructing serial reads specifies the address of one cell set CS to which the serial reads will be performed. Therefore, the serial reads differ from serial reads from two or more different cell sets CS.

When the memory device 100 receives the command instructing the serial reads, it performs step S12. Step S12 includes a setup of the potentials of the interconnects, such as the word lines WL, the select gate lines SGDL and SGSL, and the bit lines BL. Step S12 continues at step S51. In step S51, the sequencer 141 senses data read in step S12, latches data D11 obtained as a result of the sense in the data latch 143, and transmits the data D11 to the controller 200 from the data latch 143.

In step S52, the sequencer 141 again senses data read in step S12, latches data D12 obtained as a result of the sense in the data latch 143, and transmits the data D12 to the controller 200 from the data latch 143. Between the steps S51 and S52, a step corresponding to step S12 is not performed again, but the interconnects, such as the word lines WL, the select gate lines SGDL and SGSL, and the bit lines BL, maintain the states reached in step S12 up to step S52.

In step S53, the controller 200 compares the data D11 and the data D12 between corresponding bits, and counts the number N1 of bits with mismatching values. The value N1 is the number of the unstable cells with the read voltage V0. The number of mismatching bits can be obtained by, for example, the operation of the exclusive logical sum for corresponding bits of the data D11 and the data D12, followed by counting of resultant "1" bits.

The controller 200 and the memory device 100 then perform step S55, S15, S56, S57, and S58. Step S55 is similar to step S50, and differs from step S50 only in the specified voltage. Step S56, S57, and S58 are the same as step S51, S52, and S53 respectively. Therefore, as a result of step S58, the number N2 of the unstable cells with the read voltage V1 is obtained.

In step S59, the controller 200 converts the number N1 into a number H1, and the number N2 into a number H2. The conversion is performed based on a predetermined relation between the number of the unstable cells from a read with a particular voltage as the read voltage, and the number of the cell transistors MT with the threshold voltages of the same value as that particular voltage, as illustrated in, for example, FIG. 17. Specifically, the conversion can be performed with an equation, or simply the number of the unstable cells can be multiplied to be converted into the corresponding number of the cell transistors.

Step S59 continues at step S31, and steps S31 to S37 are performed as in the first embodiment (FIG. 11). Thus, the retry read completes.

Figure 22:
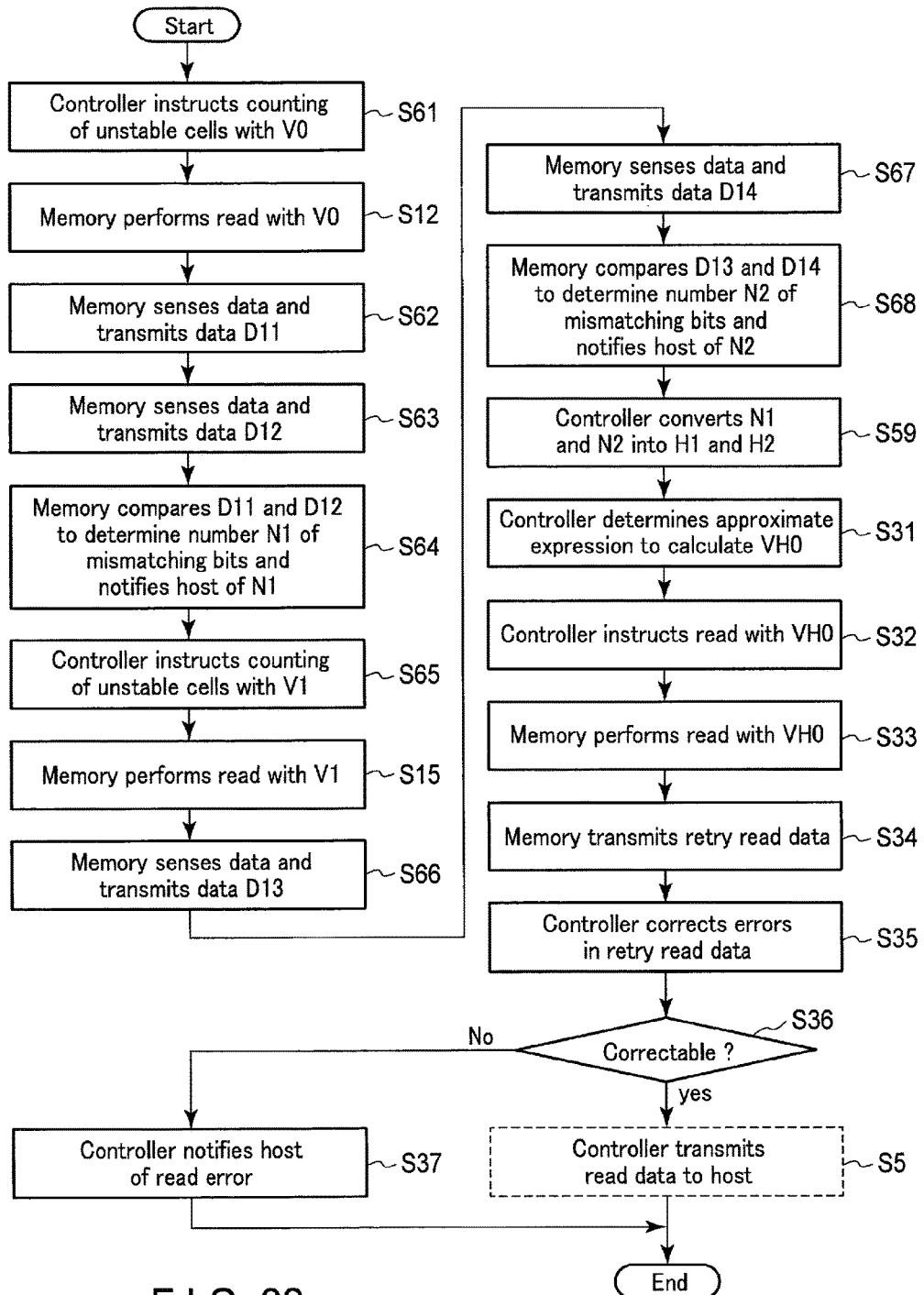
FIG. 22 illustrates another subflow in the flow of the read in the third embodiment.

The numbers H1 and H2 may be determined by the memory device 100, as illustrated in FIG. 22. The flow of FIG. 22 mainly differs in what performs some steps, and is generally similar to the flow of FIG. 21.

First, as illustrated in FIG. 22, in step S61 the controller 200 transmits to the memory device 100 a command which instructs calculation of unstable cells with the read voltage V0. When the memory device 100 receives the command, it uses the read voltage V0 to read data from the read-target cell set CS in step S12. Then in step S62, the sequencer 141 senses data read in step S12, and latches the data D11 obtained through the sense in the data latch 143.

In step S63, the sequencer 141 again senses data read in step S12, and latches the data D12 obtained through the sense in the data latch 143. Between steps S62 and S63, the interconnects, such as the word lines WL, the select gate lines SGDL and SGSL, and the bit lines BL, maintain the states reached at step S12. This point is the same as steps S51 and S52.

In step S64, the sequencer 141 compares the data D11 and the data D12 between corresponding bits, and counts the number N1 of bits with mismatching values. Step S64 is generally the same as step S53. For calculation of the number N1, the sense amplifier 113 includes an operation circuit and a counter, for example. The data indicative of the determined number N1 is transmitted from the memory device 100 to be received by the controller 200.

The controller 200 and/or the memory device 100 then perform steps S65, S15, S66, S67, and S68. Steps, S65, S15, S66, S67, and S68 are generally the same as steps S61, S12, S62, S63, and S64 respectively with a main difference of the read voltages V0 or V1. The data indicative of the number N2 determined as a result of step S68 is transmitted from the memory device 100 to be received by the controller 200. Step S68 continues at step S59, and processing after step S68 is the same as that of FIG. 21.

For determination of unstable cells, three or more reads may be performed. In this case, for determination of the unstable cells, various methods are possible. For example, when a bit in the data of the third or more data differs from the corresponding bit in the first data, the cell storing that bit is determined to be unstable. Alternatively, when a bit in particular data differs from the corresponding bit in the previous data, the cell storing that bit is determined to be unstable. With more reds, the number of unstable bits can be determined with a higher accuracy. More reads, however, lead to an increased time for determination. Therefore, the number of reads can be determined by balancing the required accuracy and acceptable time.

As described, as in the first embodiment, the controller 200 according to the third embodiment estimates the curve of a threshold voltage distribution from the two numbers of the cell transistors MT with respective two threshold voltages, and from the estimated distribution curve estimates a better read voltage. This can produce the same advantages as those of the first embodiment.

Furthermore, according to the third embodiment, the number of the cell transistors MT with a particular threshold voltage is calculated from the number of unstable cells. Specifically, the controller 200 transmits to the memory device 100 the command which instructs two or more reads while maintaining the states of the interconnects in the memory device 100. When the memory device 100 receives this command, it transmits data items obtained by two or more senses (latching) to the controller 200 while maintaining the states of interconnects set up for a read. The controller 200 determines the number of unstable cells from comparison of the data items. Thus, for plural reads, the whole process of plural reads does not need to be repeated. In general, in a time for a read, a time for stabilization of the states of interconnects (in particular word lines WL) is dominant, and, therefore, plural reads can effectively complete within a time substantially the same as a time for one read. Therefore, with a time shorter than that in the first embodiment, a better read voltage can be estimated.

Fourth Embodiment

The fourth embodiment is based on the first to third embodiments, and is a combination of the second and third embodiments.

The memory system 1 of the fourth embodiment includes the same devices as the first embodiment (FIG. 1) although the controller 200 and the memory device 100 are configured to perform the operations described in the following.

Figure 23:
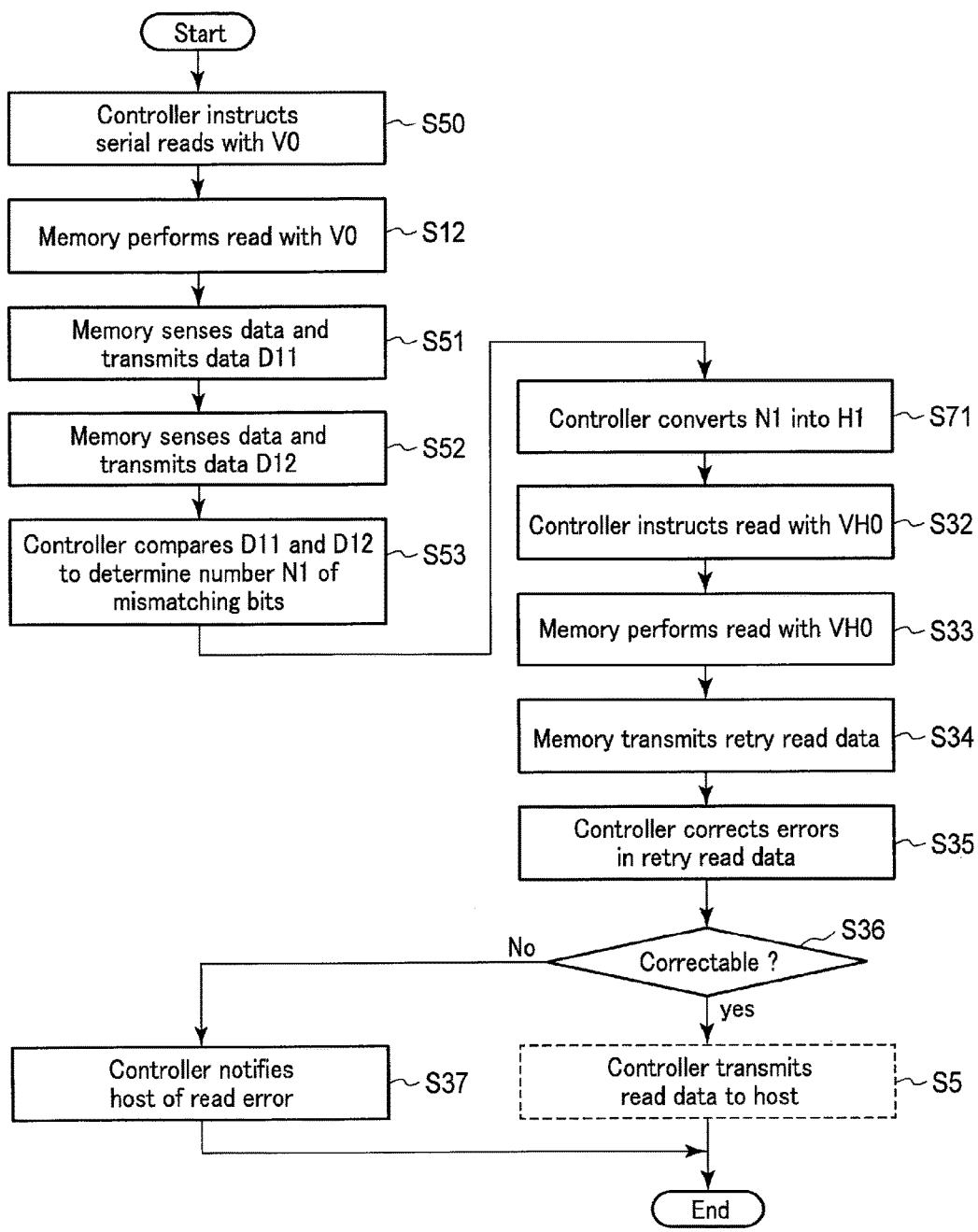
FIG. 23 illustrates a subflow in a flow of a read in a fourth embodiment.

The operations of the memory system 1 of the fourth embodiment will be described with reference to FIG. 23. The read of the fourth embodiment follows the flow of the FIG. 10 of the first embodiment. In contrast, in the fourth embodiment, the flow of the retry read in FIG. 10 (step S6) differs from that in the first embodiment and performs a subflow illustrated in FIG. 23 as step S6. FIG. 23 illustrates the subflow in the flow of read of the fourth embodiment.

The controller 200 and/or the memory device 100 perform steps S50, S12, S51, S52, and S53. As a result of step S53, the number N1 of unstable cells is obtained. The controller 200 then converts the number N1 into a number H1 of the cell transistors in step S71. The conversion is performed by the same method as that in step S59.

After step S71, the flow continues at step S32. The controller 200 and/or the memory device 100 perform steps S32 to S37 as in the first embodiment. In this way, the read including a retry read completes.

Also in the fourth embodiment, as in the third embodiment, step S51, S52, and S53 may be replaced by step S62, S63, and S64.

As described, as in the second embodiment the controller 200 according to the fourth embodiment estimates the curve of a threshold voltage distribution from the number of the cell transistors MT with a particular threshold voltage, and from the estimated distribution curve estimates a better read voltage. This can produce the same advantages as those in the second embodiment. Furthermore, according to the fourth embodiment, the number of the cell transistors MT with a particular threshold voltage is calculated from the number of unstable cells as in the third embodiment. This can produce the same advantages as in the third embodiment. Therefore, a better read voltage can be estimated within a time shorter than those in the first and second embodiments.

The first to fourth embodiments are applicable to a method of storing two, four, eight or more bits per cell transistor. Moreover, the memory device 100 can be another nonvolatile memory device, such as a resistive random access memory (ReRAM) other than the NAND flash memory.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A memory controller configured to control a memory device, comprising:
   a host interface configured to receive a read command from an outside of the memory controller; and
   a read controller configured to perform a data read operation on the memory device according to the read command, wherein
   the read controller performs a data read operation on a set of memory cells of the memory device and determines a first value and a second value, the first value being a number of memory cells having a first threshold voltage among the set of memory cells and the second value being a number of memory cells having a second threshold voltage among the set of memory cells, and
   the read controller determines a formula representing a relationship between a threshold voltage of memory cells and a number of memory cells having the threshold voltage from a predetermined formula based on the first value, the second value, the first threshold voltage, and the second threshold voltage, determines a first read voltage based on the determined formula, and performs a data read operation on the set of memory cells using the first read voltage, the determined formula being a quadratic function, the predetermined formula being a quadratic function representing a relationship between a threshold voltage of memory cells and a number of memory cells, a number of memory cells at the vertex of the quadratic function of the predetermined formula being known, a coefficient in a quadratic term of the quadratic function of the predetermined formula being unknown, and a voltage at the vertex of the quadratic function of the predetermined formula being unknown.

2. The controller of claim 1, wherein
   the read controller performs a data read operation to the set of memory cells with a second read voltage,
   when correctable data cannot be read with the data read operation with the second read voltage and error correction through an error correction code, the read controller determines the first read voltage and performs a data read operation to the set of memory cells with the first read voltage.

3. The controller of claim 1, wherein
   the first threshold voltage and the second threshold voltage are voltages lower than a threshold voltage of a peak of a threshold voltage distribution of the set of memory cells including the first threshold voltage and the second threshold voltage.

4. The controller of claim 1, wherein
   the read controller determines a threshold voltage with which a number of memory cells in the set of the memory cells is calculated as zero from the determined formula, and determines the determined threshold voltage as the first read voltage.

5. The controller of claim 1, wherein
   the read controller uses the first and second threshold voltages and the first and second values to determine the coefficient in the quadratic term of the quadratic function of the predetermined formula and the voltage at the vertex of the quadratic function of the predetermined formula, and determines the first read voltage based on the formula including the determined coefficient in the quadratic term of the quadratic function and determined voltage at the vertex of the quadratic function.

6. The controller of claim 1, wherein
   based on having issued one or more commands, the read controller receives first data and second data, determines the number of bits in which values differ between the first data and the second data, and estimates the first value based on the number of bits.

7. The controller of claim 6, wherein
   the read controller estimates the first value based on the number of bits and a predetermined relation.

8. The controller of claim 1, wherein
   the read controller:
   instructs a read from the set of memory cells with the first threshold voltage as a read voltage,
   receives first data,
   instructs a read from the set of memory cells with a first voltage lower than the first threshold voltage as a read voltage,
   receives second data, and
   uses as the first value a difference between the number of bits of a first data value in the first data and the number of bits of the first data value in the second data.

9. The controller of claim 5, wherein
   the read controller determines the coefficient in the quadratic term of the quadratic function of the predetermined formula and the voltage at the vertex of the quadratic function of the predetermined formula by substituting the first and second threshold voltages and the first and second values in the predetermined formula.

10. A memory controller configured to control a memory device, comprising:
    a host interface configured to receive a read command from an outside of the memory controller; and
    a read controller configured to perform a data read operation on the memory device according to the read command, wherein
    the read controller performs a data read operation on a set of memory cells of the memory device and determines a first value, the first value being a difference between a number of memory cells that output a first data value when read with a first voltage applied as a read voltage and a number of memory cells that output the first data value when read with a second voltage applied as a read voltage, and
    the read controller determines a first read voltage from a predetermined formula based on only the first value and the first voltage, and performs a data read operation on the set of memory cells using the first read voltage, the determined formula being a quadratic function, the predetermined formula being a quadratic function representing a relationship between a threshold voltage of memory cells and a number of memory cells having the threshold voltage, a number of memory cells at the vertex of the quadratic function of the predetermined formula being known, a coefficient in a quadratic term of the quadratic function of the predetermined formula being known, and a voltage at the vertex of the quadratic function of the predetermined formula being unknown.

11. The controller of claim 10, wherein
the read controller performs a data read operation to the set of memory cells with a second read voltage,
when correctable data cannot be read with the data read operation with the second read voltage and error correction through an error correction code, the read controller determines the first read voltage and performs a data read operation to the set of memory cells with the first read voltage.

12. The controller of claim 10, wherein
the first voltage is a voltage lower than a threshold voltage of a peak of a threshold voltage distribution of the set of memory cells including the first voltage.

13. The controller of claim 10, wherein
the read controller uses the first voltage and the first value to determine the voltage at the vertex of the quadratic function, and determines the first read voltage based on the formula including the determined coefficient in the quadratic term of the quadratic function.

14. The controller of claim 10, wherein
the controller determines the first read voltage based on the first value and a predetermined relation.

15. The controller of claim 10, wherein
based on having issued one or more commands, the read controller receives first data and second data, determines the number of bits in which values differ between the first data and the second data, and estimates the first value based on the number of bits.

16. The controller of claim 15, wherein
the read controller estimates the first value based on the number of bits and a predetermined relation.

17. The controller of claim 10, wherein
the read controller:
instructs a read from the set of memory cells with the first voltage as a read voltage,
receives first data,
instructs a read from the set of memory cells with the second voltage, which is lower than the first threshold voltage, as a read voltage,
receives second data, and
uses as the first value a difference between the number of bits of the first data value in the first data and the number of bits of the first data value in the second data.

18. The controller of claim 13, wherein
the read controller determines the voltage at the vertex of the quadratic function of the predetermined formula by substituting the first voltage and the first value in the predetermined formula.

\* \* \* \* \*